United States Patent
Yu et al.

(10) Patent No.: US 10,749,120 B2
(45) Date of Patent: Aug. 18, 2020

(54) METHOD OF FABRICATING ORGANO-LEAD HALIDE PEROVSKITES THIN SINGLE CRYSTALS

(71) Applicant: King Abdullah University of Science and Technology, Thuwal (SA)

(72) Inventors: Weili Yu, Thuwal (SA); Aram Amassian, Thuwal (SA); Liyang Yu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/330,852

(22) PCT Filed: Sep. 5, 2017

(86) PCT No.: PCT/IB2017/055346
§ 371 (c)(1),
(2) Date: Mar. 6, 2019

(87) PCT Pub. No.: WO2018/047066
PCT Pub. Date: Mar. 15, 2018

(65) Prior Publication Data
US 2019/0221755 A1  Jul. 18, 2019

Related U.S. Application Data

(60) Provisional application No. 62/384,806, filed on Sep. 8, 2016.

(51) Int. Cl.
*H01L 51/00* (2006.01)
*H01L 51/05* (2006.01)
*C07F 7/24* (2006.01)

(52) U.S. Cl.
CPC ...... *H01L 51/0077* (2013.01); *H01L 51/0024* (2013.01); *H01L 51/0026* (2013.01); *H01L 51/0558* (2013.01); *C07F 7/24* (2013.01)

(58) Field of Classification Search
CPC ............. H01L 51/0024; H01L 51/0026; H01L 51/0077; H01L 51/0558
See application file for complete search history.

(56) References Cited

U.S. PATENT DOCUMENTS

2003/0170918 A1  9/2003  Dehaven
2017/0229249 A1*  8/2017  Snaith .................. H01L 51/001

FOREIGN PATENT DOCUMENTS

WO  2016151535 A1  9/2016
WO  2017083408 A1  5/2017

OTHER PUBLICATIONS

Dequilettes, et al., "Impact of microstructure on local carrier lifetime in perovskite solar cells", Science, May 8, 2015, 683-686.
(Continued)

*Primary Examiner* — Hoai V Pham
(74) *Attorney, Agent, or Firm* — Billion & Armitage; Lisbeth C. Robinson

(57) ABSTRACT

Embodiments of the present disclosure describe a method of fabricating a semiconducting material, comprising fixing a first substrate to a second substrate via a bonding material sufficient to form a two-substrate support with a cavity region, applying an organo-lead halide perovskite precursor solution to the cavity region of the two-substrate support, and annealing sufficient to form in the cavity region a semiconducting material including an organo-lead halide perovskite thin single crystal. Embodiments of the present disclosure further describe a transistor comprising a source terminal, a drain terminal, a channel layer extending between the source terminal and the drain terminal and including an organo-lead halide perovskite thin single crys-
(Continued)

tal, a gate terminal, and an insulating layer separating the gate terminal from the source terminal, drain terminal, and channel layer sufficient to form a transistor.

15 Claims, 20 Drawing Sheets

(56) References Cited

OTHER PUBLICATIONS

Dong, et al., "Electron-hole diffusion lengths > 175 urn in solution-grown CH3NH3PbI3 single crystals", Science, Feb. 27, 2015, 967-970.
Dou, et al., "Atomically thin two-dimensional organic-inorganic hybrid perovskites", Science, Sep. 25, 2015, 1518-1521.
Fang, et al., "Highly narrowband perovskite single-crystal photodetectors enabled by surface-charge recombination", nature photonics, Oct. 2015, 679-686.
Gauthron, et al., "Optical spectroscopy of two-dimensional layered (C6H5C2H4-NH3)2-PbI4 perovskite", Optics Express, Mar. 15, 2010, 5912-5919.
Green, et al., "The emergence of perovskite solar cells", nature photonics, Macmillan Publishers Limited, Jul. 2014, 506-514.
Guo, et al., "A nanocomposite ultraviolet photodetector based on interfacial trap-controlled charge injection", nature nanotechnology, Macmillan Publishers Limited, Dec. 2012, 798-802.
Kim, "The Role of Intrinsic Defects in Methylammonium Lead Iodide Perovskite", The Journal of Physical Chemistry Letters, American Chemical Society, 2014, 1312-1317.
Lin, et al., "Filterless narrowband visible photodetectors", nature photonics, Oct. 2015, 687-694.
Liu, et al., "Two-Inch-Sized Perovskite CH3NH3PbX3 (X = Cl, Br, I) Crystals: Growth and Characterization", Advanced Material, 2015, 5176-5183.
Nie, et al., "High-efficiency solution-processed perovskite solar cells with millimeter-scale grains", Science, Jan. 30, 2015, 522-525.
Niu, et al., "Exfoliation of self-assembled 2D organic-inorganic perovskite semiconductors", Appl. Phys. Lett., 2014, 1-5.
Qin, et al., "Inorganic hole conductor-based lead halide perovskite solar cells with 124% conversion efficiency", nature commmunications, Macmillan Publishers Limited, 2014, 1-6.
Radisavljevic, et al., "Single-layer MoS2 transistors", nature nanotechnology, Macmillan Publishers Limited, Mar. 2011, 147-150.
Samiee, et al., "Defect density and dielectric constant in perovskite solar cells", Applied Physics Reviews, 2014, 1-5.
Shi, "Low trap-state density and long carrier diffusion in organolead trihalide perovskite single crystals", Science, Jan. 30, 2015, 519-522.
Shi, et al., "Spiro-OMeTAD single crystals: Remarkably enhanced charge-carrier transport via mesoscale ordering", Sci. Adv., 2016, 1-6.
Wang, et al., "Wafer-scale growth of large arrays of perovskite microplate crystals for functional electronics and optoelectronics", Sci. Adv., 2015, 1-8.
Yang, "High-performance photovoltaic perovskite layers fabricated through intramolecular exchange", Science, Jun. 12, 2015, 1234-1237.
Notification of Transmittal of the International Search Report and the Written Opinion of the International Searching Authority, or the Declaration for PCT/IB2017/055346 dated Dec. 12, 2017.
Li, et al., "Ambipolar solution-processed hybrid perovskite phototransistors", Nature Communications, Sep. 8, 2015, 1-8.
Maculan, et al., "CH3NH3PbCl3 Single Crystals: Inverse Temperature Crystallization and Visible-Blind UV-Photodetector", The Journal of Physical Chemistry Letters, 6, 2015, 3781-3786.
Nguyen, et al., "Optically pumped lasing in single crystals of organometal halide perovskites prepared by cast-capping method", Applied Physics Letters, 1089, Jun. 27, 2016, 261105-1-261105-5.
Peng, et al., "Solution-Grown Monocrystalline Hybrid Perovskite Films for Hole-Transporter-Free Solar Cells", Advanced Materials, Mar. 2, 2016, 3383-3390.
Saidaminov, et al., "High-quality bulk hybrid perovskite single crystals within minutes by inverse temperature crystallization", Nature Communications, Jul. 6, 2015, 1-6.
Shi, et al., "Low trap-state density and long carrier diffusion in organolead trihalide perovskite single crystals", Science, vol. 347, 1-30-15, 519-522.

* cited by examiner

METHOD OF FABRICATING ORGANO-LEAD HALIDE PEROVSKITES THIN SINGLE CRYSTALS

BACKGROUND

Organo-lead halide perovskites' attractive optical and electrical properties has given rise to an increased interest in fabricating optoelectronic devices based on organo-lead halide perovskites. For instance, organo-lead halide perovskite polycrystalline thin films have been explored, but the small grain size and presence of grain boundaries has limited the performance and application of organo-lead halide perovskite polycrystalline thin films in optoelectronic devices. While the larger grain sizes and fewer grain boundaries of bulk single crystals sparked interest in perovskite bulk single crystals, the performance of optoelectronic devices based on perovskite bulk single crystals has been inferior to those based on perovskite polycrystalline films due to high surface trap densities and uncontrollable crystal thickness.

SUMMARY

In general, embodiments of the present disclosure describe a method of fabricating a semiconducting material and a transistor.

Accordingly, embodiments of the present disclosure describe a method of fabricating a semiconducting material, comprising fixing a first substrate to a second substrate via a bonding material sufficient to form a two-substrate support with a cavity region, applying an organo-lead halide perovskite precursor solution to the cavity region of the two-substrate support, and annealing sufficient to form in the cavity region a semiconducting material including an organo-lead halide perovskite thin single crystal.

Embodiments of the present disclosure further describe a transistor comprising a source terminal, a drain terminal, a channel layer extending between the source terminal and the drain terminal and including an organo-lead halide perovskite thin single crystal, a gate terminal, and an insulating layer separating the gate terminal from the source terminal, drain terminal, and channel layer sufficient to form a transistor.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which.

DETAILED DESCRIPTION

Figure 1:
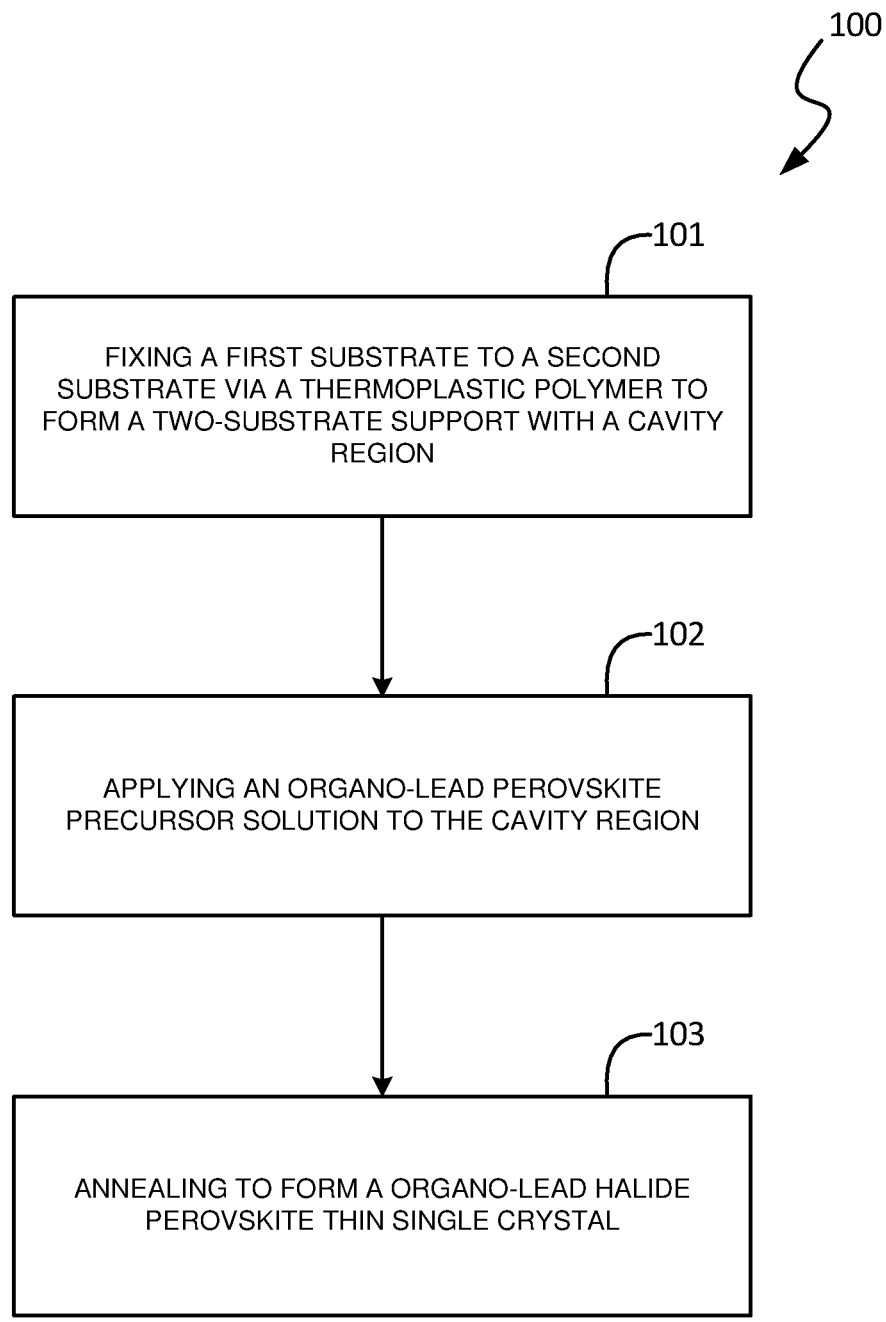
FIG. 1 illustrates a block flow diagram of a method of fabricating a semiconducting material, according to one or more embodiments of the present disclosure.

The invention of the present disclosure generally relates to methods of fabricating semiconducting materials and a transistor based on the semiconducting materials. The semiconducting materials may include thin perovskite single crystals. For example, the semiconducting materials may include organo-lead halide perovskite thin single crystals characterized by the formula MAPbX$_3$, where X is Cl, Br, and/or I. To fabricate the semiconducting materials, a two-substrate-assistant strategy may be used to form semiconducting materials (e.g., organo-lead halide perovskite thin single crystals) with millimeter-scale size, a surface that is smooth with less defects than conventional thin single crystals, and fixed thicknesses. Moreover, the semiconducting materials can be commercially manufactured at moderate to low cost, with low-temperature solution-processability. Further, semiconducting materials (e.g., thin perovskite single crystals) fabricated in this way are excellent candidates for and may be included in transistors. For example, the organo-lead halide perovskite thin single crystals exhibit attractive optical and electrical properties that can be achieve high performance in optoelectronic devices (e.g., photodetectors, phototransistors, and photovoltaics) as semiconductor material.

The organo-lead halide perovskite thin single crystals of the present disclosure can be fabricated with unprecedented control over crystal thickness, crystal size, and scalability, as well as surface roughness and surface defects. The high crystallinity and smooth surface morphology of the organo-lead halide perovskite thin single crystals of the present disclosure has given rise to unprecedented field effect mobilities. In particular, the field effect mobilities of the organo-lead halide perovskite thin single crystals of the present disclosure can be as much as 122-fold higher than that of polycrystalline thin films at room temperature and over 7.5-times higher than that of thin single crystals at 77K. In addition, as confirmed via AFM and STM characterizations, the organo-lead halide perovskite thin single crystals of the present disclosure exhibit, for the first time, layer-by-layer structures.

The organo-lead halide perovskite thin single crystals of the present disclosure can be monocrystalline films free or nearly free of grain boundaries, with exceptional trap densities, carrier mobilities, and carrier diffusion lengths. The organo-lead halide perovskite thin single crystals of the present disclosure can exhibit, among other things, one or more of low surface trap density, high carrier mobility, long carrier diffusion length, high power conversion efficiency, scalability, smooth surface morphology, layer-by-layer structure, ambipolar-type transportation, even crystal dispersion, a lack or absence of grain boundaries, a lack or absence of pinholes, and high crystallinity. The organo-lead halide perovskite thin single crystals of the present disclosure can further exhibit tunable optical properties, high-absorption coefficients, long-ranged balanced electron and hole transport, low cost, and facile deposition techniques, among other things.

Accordingly, embodiments of the present disclosure describe a method of fabricating a semiconducting material, comprising fixing a first substrate to a second substrate via a bonding material sufficient to form a two-substrate support with a cavity region, applying an organo-lead halide perovskite precursor solution to the cavity region of the two-substrate support, and annealing sufficient to form in the cavity region a semiconducting material including an organo-lead halide perovskite thin single crystal. Embodiments of the present disclosure further describe a transistor comprising a source terminal, a drain terminal, a channel layer extending between the source terminal and the drain terminal and including an organo-lead halide perovskite thin single crystal, a gate terminal, and an insulating layer separating the gate terminal from the source terminal, drain terminal, and channel layer sufficient to form a transistor.

Definitions

The terms recited below have been defined as described below. All other terms and phrases in this disclosure shall be construed according to their ordinary meaning as understood by one of skill in the art.

As used herein, "fixing" refers to fixing, adhering, annealing, connecting, attaching, bonding, and binding.

As used herein, "applying" refers to applying, coating, spin-coating, contacting, introducing, inserting, injecting, dropping, pipetting, wetting, spreading, spreading via capillary action and/or force.

As used herein, "annealing" refers to any process involving heating and/or cooling.

Embodiments of the present disclosure describe a method of fabricating a semiconducting material and a transistor.

Embodiments of the present disclosure describe a method of fabricating a semiconducting material comprising fixing 101 a first substrate to a second substrate via a bonding material sufficient to form a two-substrate support with a cavity region, applying 102 an organo-lead halide perovskite precursor solution to the cavity region of the two-substrate support, and annealing 103 sufficient to form in the cavity region a semiconducting material including an organo-lead halide perovskite thin single crystal. The order of steps 101 through 103 shall not be limiting as steps 101 through 103 may be performed in any order.

At step 101, a first substrate is fixed to a second substrate via a bonding material sufficient to form a two-substrate support with a cavity region. In some embodiments, the second substrate is fixed to the first substrate via a bonding material sufficient to form a two-substrate support with a cavity region. The two-substrate support can provide control over one or more of the thickness, size, shape, and scalability of the organo-lead halide perovskite thin single crystal. The two-substrate support can also provide control over the surface roughness and surface defects. In this way, the organo-lead halide perovskite thin single crystal is tunable to desired optoelectronic properties.

The two-substrate support can include a first substrate, a second substrate, and a bonding material. In some embodiments, the two-substrate support can include an upper first substrate and a lower second substrate with a bonding material positioned between the upper first substrate and the lower second substrate. In some embodiments, the two-substrate support can include an upper second substrate and a lower first substrate with a bonding material positioned between the upper second substrate and the lower first substrate. In some embodiments, the bonding material is applied to the first substrate only to fix the first substrate to the second substrate. In some embodiments, the bonding material is applied to the second substrate only to fix the first substrate to the second substrate. In some embodiments, the bonding material is applied to both the first substrate and the second substrate to fix the first substrate to the second substrate. In some embodiments, annealing fixes the first substrate to the second substrate via the bonding material. In some embodiments, annealing includes heating at about 265° C. to about 270° C.

The first substrate and the second substrate can include one or more of an inert substrate, a semiconducting substrate, and an electrically insulating substrate. The inert substrate can include one or more of an inert material, an inert compound, and an inert element. The semiconducting substrate can include one or more of a semiconducting material, a semiconducting compound, and a semiconducting element. The electrically insulating substrate can include an electrically insulating material, an electrically insulating compound, and an electrically insulating element. In some embodiments, the two-support substrate can include a glass slide as a first substrate and an electrically insulating substrate as a second substrate. In some embodiments, the two-substrate support can include a glass slide as a second substrate and an electrically insulating substrate as a first substrate.

The bonding material can include a thermoplastic polymer and/or a thermosetting polymer. In some embodiments, the bonding material includes polyethylene terephthalate, cyanoacrylate, epoxy, methacrylate, urethane, and hot melt. A person of skill in the art would recognize that other bonding materials can be used.

The inner boundaries of the first substrate, the second substrate, and the bonding material can define the outer boundaries of the cavity region. In some embodiments the cavity region is vacant. In some embodiments, the bonding material defines the vertical boundaries of the cavity region and the first substrate and the second substrate define the horizontal boundaries of the cavity region. In some embodiments, the bonding material defines the vertical boundaries of the cavity region and the first substrate and the second substrate define the horizontal boundaries of the cavity region, with the two-substrate support further including a third substrate, such as a semiconducting substrate, in contact with one or more of the first substrate and the second substrate, but neither in contact with the cavity region, nor defining any boundary of the cavity region.

In some embodiments, the bonding material defines the horizontal boundaries of the cavity region and the first substrate and the second substrate define the vertical boundaries of the cavity region. In some embodiments, the bonding material defines the horizontal boundaries of the cavity region and the first substrate and the second substrate define the vertical boundaries of the cavity region, with the two-substrate support further including a third substrate, such as a semiconducting substrate, in contact with one or more of the first substrate and the second substrate, but neither in contact with the cavity region, nor defining any boundary of the cavity region.

At step 102, an organo-lead halide perovskite precursor solution is applied to the cavity region of the two-substrate support. The organo-lead halide perovskite precursor solution can include one or more of a solvent, MAX, and $PbX_2$, wherein MA is $CH_3NH_3^+$ and X is one or more of $Cl^-$, $Br^-$, and $I^-$. The solvent can include one or more of γ-butyrolactone, N,N-dimethylformamide, dimethylsulphoxide, and any other solvents known to a person skilled in the art. Applying the organo-lead halide perovskite precursor solution to the cavity region of the two-substrate support can include spreading the organo-lead halide perovskite solution by capillary action and/or capillary force.

At step 103, annealing takes place sufficient to form in the cavity region a semiconducting material including an organo-lead halide perovskite thin single crystal. The organo-lead halide perovskite thin single crystal is characterized by the formula $MAPbX_3$, where MA is $CH_3NH_3^+$ and X is one or more of $Cl^-$, $Br^-$, and $I^-$. The annealing can include heating at about a fixed temperature and for a period of time that is dependent upon the size of one or more of the first substrate, the second substrate, and the semiconducting material to be formed. In some embodiments, the annealing can include heating at a temperature that varies and can range from about 80° C. to about 140° C. In some embodiments, the temperature for preparing $MAPbCl_3$ can be about 80° C., for $MAPbBr_3$ about 100° C., and for $MAPbI_3$ about 140° C.

The organo-lead halide perovskite thin single crystal can be one or more of cubic structured and tetragonal structured. In some embodiments, $MAPbCl_3$ and $MAPbBr_3$ are cubic structured and $MAPbI_3$ is tetragonal structured. The organo-lead halide perovskite thin single crystal can be rectangular and square. The surface of the organo-lead halide perovskite thin single crystal can be smooth and nearly free of grain boundaries and/or pinholes.

The thickness, size, and shape of the semiconducting material, as well as the surface roughness and surface defects, can be controlled and/or tuned. The thickness of bonding material applied to the first substrate and/or second substrate can be used to control the thickness and/or shape of the semiconducting material formed in the cavity region. In particular, the distance between the first substrate and the second substrate can limit the thickness and/or shape of the semiconducting material formed in the cavity region. By adjusting the thickness of the bonding material applied to the first substrate and/or second substrate, the thickness and/or shape of the semiconducting material can be controlled and/or tuned. In addition, the amount of precursor solution, either by mass and/or volume, applied to the cavity region can control and/or tune the size of the semiconducting substrate formed in the cavity region. The size of the semiconducting substrate formed in the cavity region increases with the amount of precursor solution applied to the cavity region. In some embodiments, two or more applications of the precursor solution can be applied to the cavity region to increase the size of the semiconducting substrate formed in the cavity region. The surface roughness and/or surface defects of the semiconducting substrate formed in the cavity region can be controlled and/or tuned by the selection of the material, compound, and/or element comprising the first substrate and/or second substrate. The first substrate and/or the second substrate can protect the surface of the semiconducting substrate formed in the cavity region from contamination and thus protect it from undesirable roughness and defects. In one embodiment, thin single crystals can be fabricated with a chemically clean surface. In particular, thin single crystals can be fabricated with surfaces free of contaminations. This is in contrast to conventional methods of fabricating single crystals, such as bulk single crystals, which do not produce single crystals with chemically clean surfaces and/or surfaces free of contaminants Single crystals fabricated according to convention methods contain contaminants and defects.

Another embodiment of the present disclosure describes a transistor comprising a source terminal, a drain terminal, a channel layer extending between the source terminal and the drain terminal and including an organo-lead halide perovskite thin single crystal, a gate terminal, and an insulating layer separating the gate terminal from the source terminal, drain terminal, and channel layer sufficient to form a transistor. The above discussion is hereby incorporated by reference in its entirety.

The channel layer extends between the source terminal and the drain terminal and includes an organo-lead halide perovskite thin single crystal. The organo-lead halide perovskite thin single crystal can be characterized by the formula $MAPbX_3$, where MA is $CH_3NH_3^+$ and X is one or more of $Cl^-$, $Br^-$, and $I^-$.

The organo-lead halide perovskite thin single crystals can exhibit the highest field effect mobilities ever reported for $MAPbCl_3$, $MAPbBr_3$, and $MAPbI_3$ single crystals. In some embodiments, the field effect mobilities of the organo-lead halide perovskite thin single crystals can be about 122-fold higher than that of polycrystalline thin films at room temperature and about 7.5-times higher than that of TSCs measured at 77K. The high field effect mobility can be attributed to, among other things, high crystallinity and surface morphology of the organo-lead halide perovskite thin single crystals. The high mobility can be attributed to, among other things, low interfacial trap state density and an optimized interface between the organo-lead halide perovskite thin single crystals and substrates.

The organo-lead halide perovskite thin single crystals can exhibit an average roughness that was much less than polycrystalline thin films. In addition, the edge morphologies of the organo-lead halide perovskite thin single crystals can exhibit a layer-by-layer structure, which is the first time a layer-by-layer structure has been observed for cubic perovskite single crystals. The smooth surface of the organo-lead halide perovskite thin single crystals can reduce and/or eliminate leakage and/or free carrier decay, enhancing their performance as optoelectronic devices.

The organo-lead halide perovskite thin single crystals can be monocrystalline films free or nearly free of grain boundaries, with exceptional trap densities, carrier mobilities, and carrier diffusion lengths. The organo-lead halide perovskite thin single crystals can exhibit, among other things, one or more of low surface trap density, high carrier mobility, long carrier diffusion length, high power conversion efficiency, scalability, smooth surface morphology, layer-by-layer structure, ambipolar-type transportation, even crystal dispersion, a lack or absence of grain boundaries, a lack or absence of pinholes, and high crystallinity. The organo-lead halide perovskite thin single crystals can further exhibit tunable optical properties, high-absorption coefficients, long-ranged balanced electron and hole transport, low cost, and facile deposition techniques, among other things.

The transistor can include any type of transistor including, but not limited to, JFET, MOSFET, MNOS, DGMOSFET, DEPFET, FREDFET, HIGFET, MODFET, TFET, IGBT, HEMT, ISFET, BioFET, MESFET, NOMFET, GNRFET, VeSFET, CNTFET, OFET, DNAFET, and QFET. In some embodiments, the transistor is a bottom-gated FET. In some embodiments, the transistor is a top-gated FET. The insulating layer can include any type of electrically insulating and/or dielectric material know to a person of skill in the art. The transistor of the present disclosure can also include electrodes. The electrodes can include any type of material, compound, and/or element known to a person of skill in the art as functioning as an electrode. In some embodiments, the transistor is patterned with Au as electrodes. In other embodiments, the electrodes include Ag, Cu, Al, and Ca.

The following Examples are intended to illustrate the above invention and should not be construed as to narrow its scope. One skilled in the art will readily recognize that the Examiners suggest many other ways in which the invention could be practiced. It should be understand that numerous variations and modifications may be made while remaining within the scope of the invention.

Example 1

A Method of Fabricating a Semi-Conducting Material

A two-substrate-assistant and/or two-substrate support strategy was utilized to synthesize via a simple and universal process thin single crystals (TSCs) with millimeter-size scale, a smooth surface with fewer defects, and a fixed thickness of around 2.5 micrometers. Three kinds of TSCs were prepared, including $MAPbX_3$ (X=Cl, Br and I). The TSCs showed smooth surface morphology and layer-by-layer structure. Field effect transistor (FET) based on TSCs showed ambipolar type transportation, high carrier mobility, as well as low trapping density.

The inverse temperature solubility behavior of $MAPbX_3$ perovskites in certain solvents was utilized to grow $MAPbX_3$ (X=Cl, Br and I) TSCs, together with a newly developed two-substrate-assistant strategy. The two-substrate-strategy, or two-substrate-support strategy, can control both thickness and scale, and thus provide for efficient applications of TSCs.

Figure 2A:
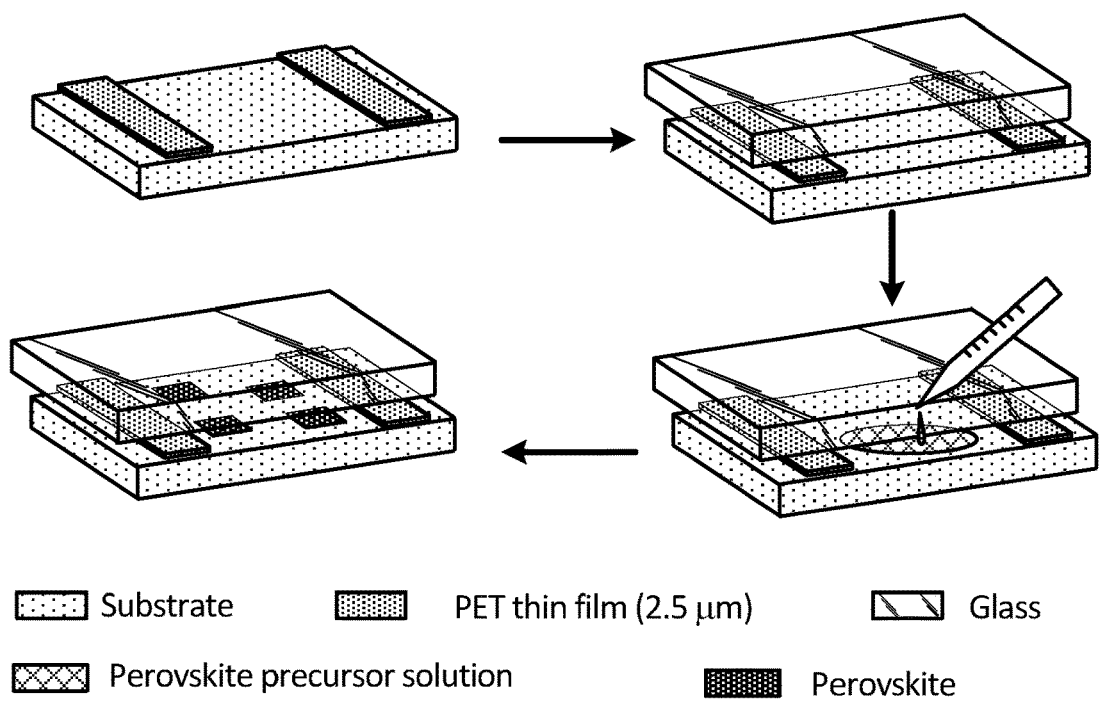
FIG. 2(a) illustrates a schematic view of a two-substrate-assistant strategy for processing perovskite single crystal thin films, according to one or more embodiments of the present disclosure.

FIG. 2(a) illustrates a schematic view of a two-substrate-assistant strategy for processing perovskite single crystal thin films, according to one or more embodiments of the present disclosure. Polyethylene terephthalate (PET) film of about 2.5 µm in thickness was utilized to confine the distance between bottom substrate and top glass. The substrate was heated to about 270° C. to melt the PET and fix the position of both bottom and top substrates. Organo-lead halide perovskite precursor solutions were introduced between the two slides and heated to form TSCs between the two slides. The temperature utilized for preparing $MAPbCl_3$ was about 80° C., for $MAPbBr_3$ was about 100° C., and for $MAPbI_3$ was about 140° C. Different from the inverse temperature crystallization process from precursor solution in the beaker or vials, the growth of TSCs was limited by two factors, the distance between two slides and the amount of precursor solution. The distance between the two slides limited the thickness of resulting TSCs and thus was used to control the thickness of the TSCs. The amount of precursor solution determined the size of resulting TSCs.

Figure 2B:
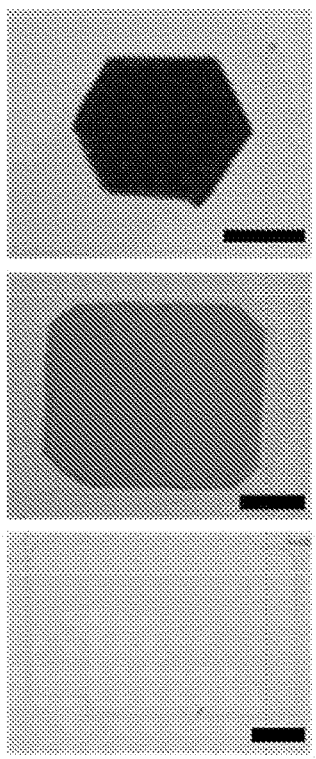
FIG. 2(b) illustrates optical images (scale bar 200 µm) of $MAPbCl_3$, $MAPbBr_3$, and $MAPbI_3$ TSCs from the top to bottom images, respectively, according to one or more embodiments of the present disclosure.

FIG. 2(b) illustrates optical images (scale bar 200 µm) of $MAPbCl_3$, $MAPbBr_3$, and $MAPbI_3$ TSCs achieved via the two-substrate assistant method from the top to bottom images, respectively, according to one or more embodiments of the present disclosure. The shapes of the TSCs were rectangle or square, correlated to the lattice structure of the crystals. The crystals were evenly dispersed, indicating that the nucleation and growth process started simultaneously on the surface of slides because of an even distribution of perovskite precursor solution. The scales of the TSCs were several hundred micrometers in length. However, the size of the TSCs was related to the precursor solution consumed for crystal growth. Fresh perovskite precursor solution can be added again to achieve larger TSCs. 5 millimeter square size TSCs were achieved here.

Figure 3A:
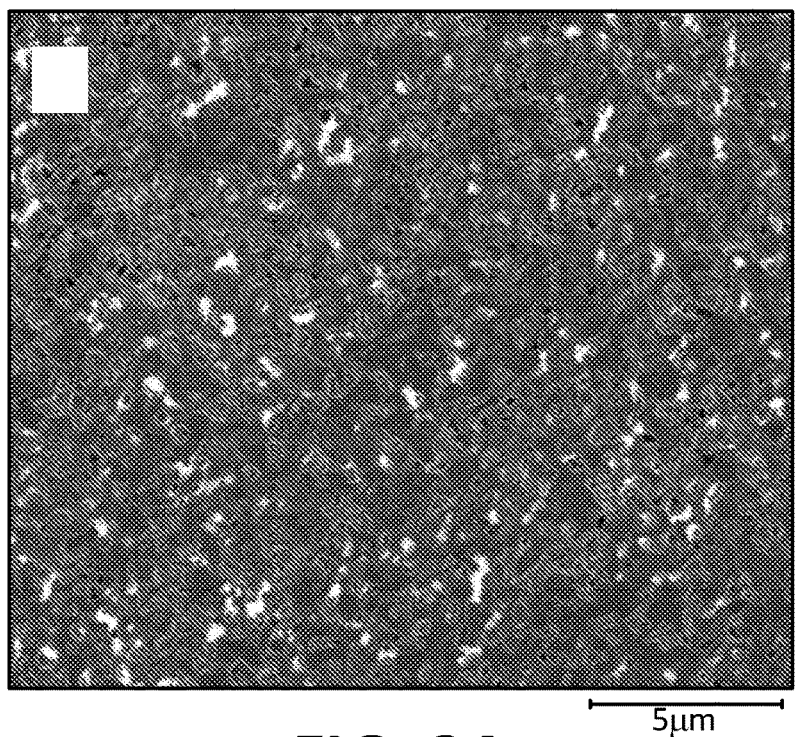
FIGS. 3(a)-(c) illustrate SEM images of (a) polycrystalline thin film (PCTF) (curr 16 pA; det TLD; HV 2.00 kV; mag 12 645x; WD 5.2 mm; mode SE; Nova Nano), (b) bulk single crystal (BSC) (det TLD, HV 5.00 kV; mag 14 968x; WD 5.1 mm; curr 28 pA; mode SE; spot 2.5; Nova Nano), and (c) thin single crystal (TSC) of $MAPbBr_3$ samples (det TLD; HV 5.00 kV; mag 15 134x; WD 5.0 mm; curr 28 pA; mode SE; spot 2.5; Nova Nano), according to one or more embodiments of the present disclosure.
Figure 3B:
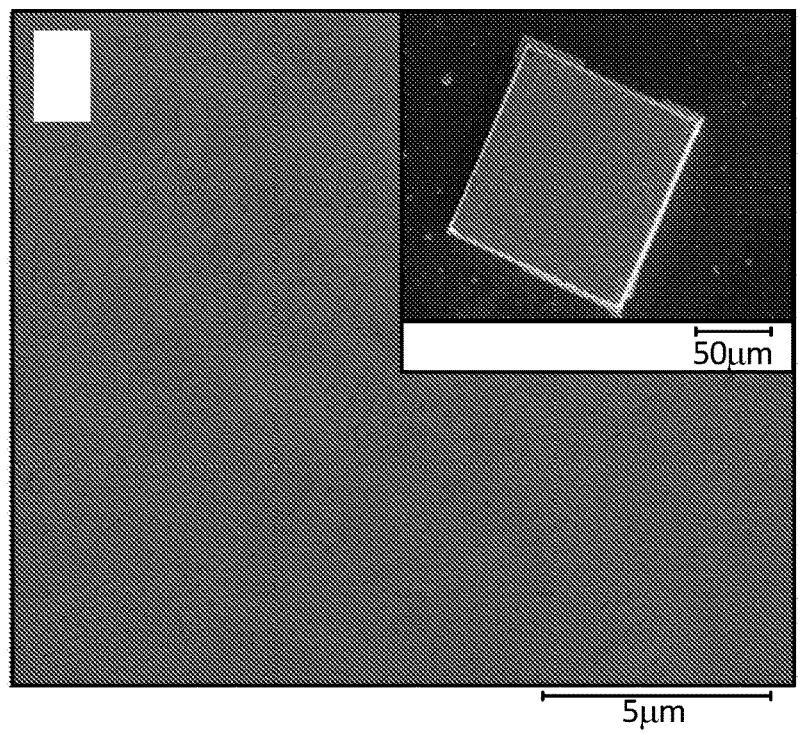
Figure 3C:
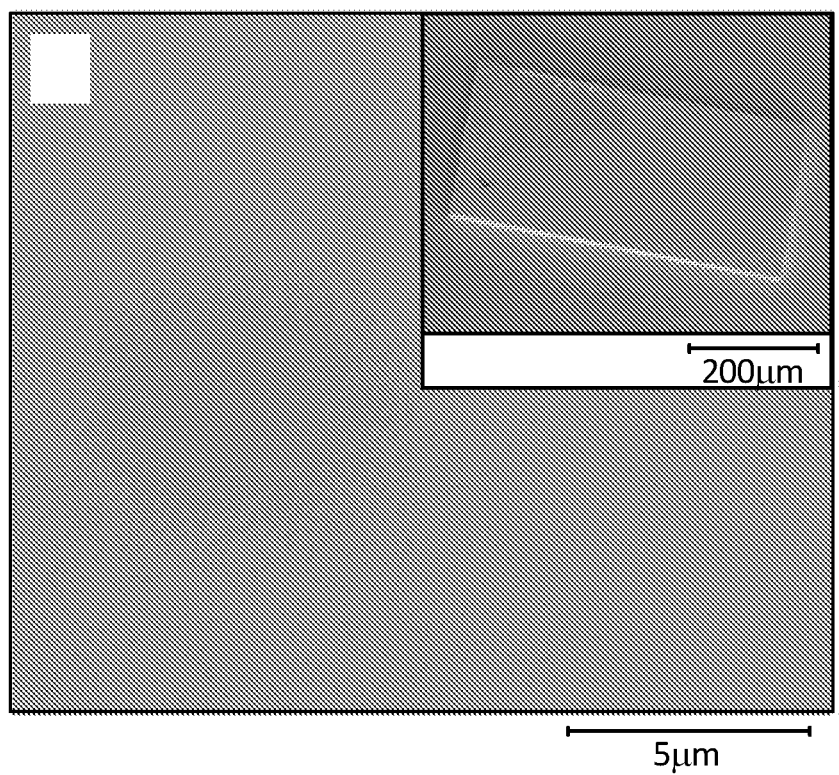
Figure 4:
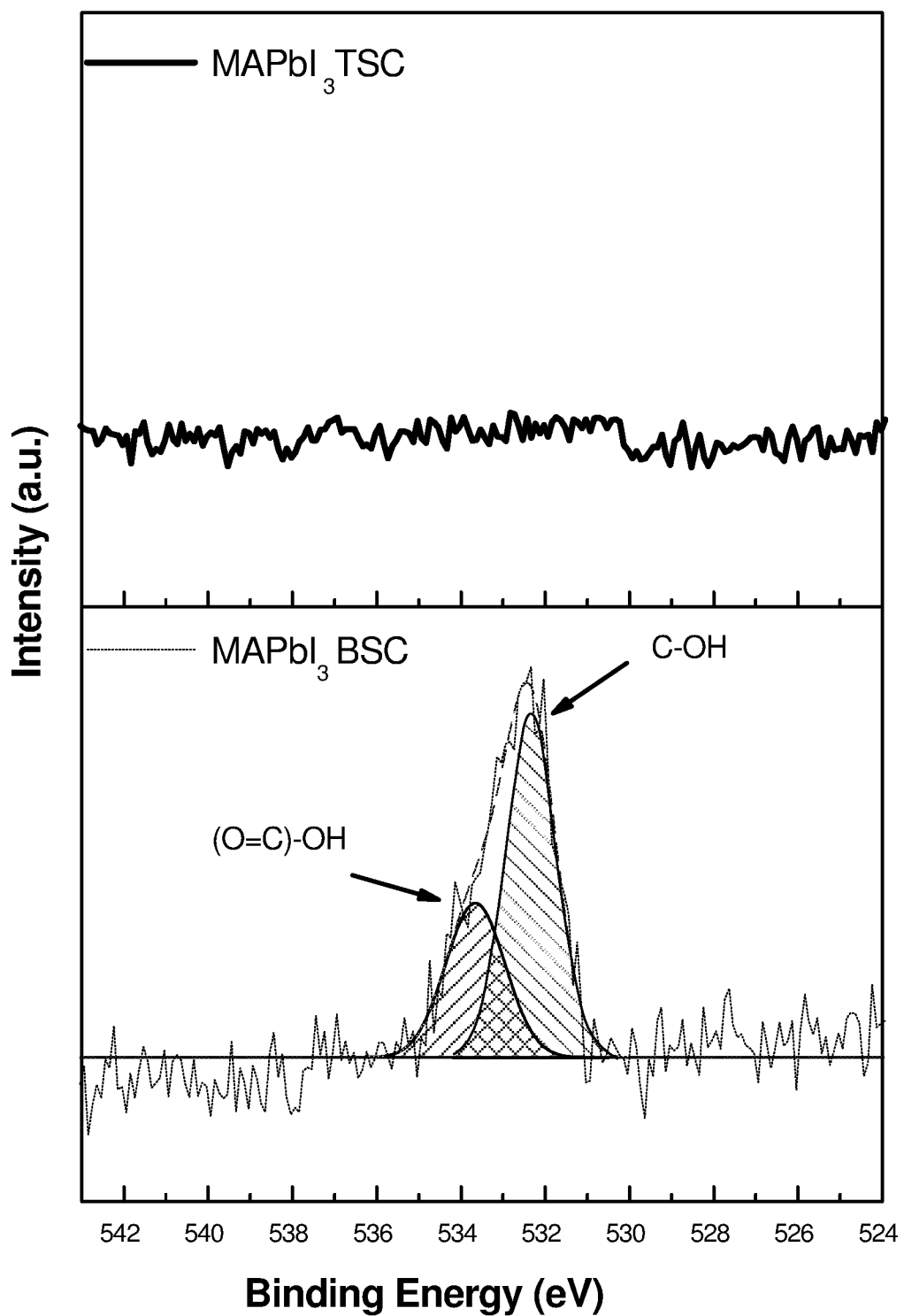
FIG. 4 illustrates XPS spectra of the surface of thin single crystals showing a chemically clean surface, according to one or more embodiments of the present disclosure.

Compared to PCTFs and BSCs, the morphology of TSC is much more uniform. FIGS. 3(a)-(c) illustrate SEM images of (a) polycrystalline thin film (PCTF), (b) bulk single crystal (BSC), and (c) thin single crystal (TSC) of MAPbBr$_3$ samples, according to one or more embodiments of the present disclosure. As shown in FIG. 3, the SEM images of MAPbBr$_3$ show significant differences between and among PCTFs, BSCs, and TSCs and confirm that the surface of the TSC is much smoother than that of PCTF and BSC. For PCTF, the film is composed of a large amount of crystal grains and pinholes. For BSC, the surface is smoother with some contaminants remaining on the surface. For TSC, the surface is the smoothest and clean, without any grain boundaries and pinholes. As the grain boundary is unbeneficial for charge transfer, TSCs can be used in high performance optoelectronics. In addition, FIG. 4 illustrates XPS spectra of the surface of thin single crystals, according to an embodiment of the present disclosure. As shown in FIG. 4, thin single crystals were fabricated with a chemically clean surface and were free of contaminants, unlike single crystals, such as bulk single crystals, fabricated using conventional methods. Conventional methods of fabricating single crystals do not produce single crystals with chemically clean surfaces. The surfaces of single crystals fabricated using conventional methods have surfaces with contaminants.

Figure 2C:
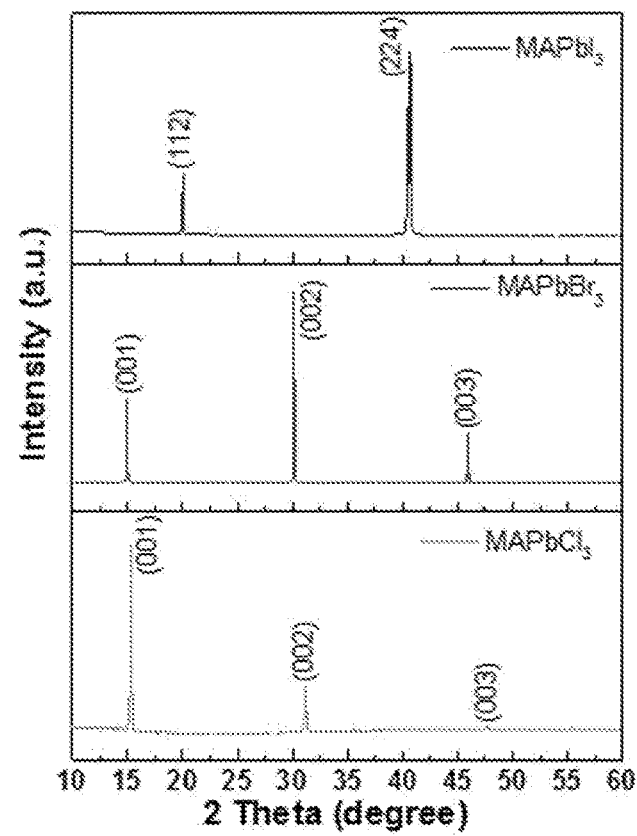
FIG. 2(c) illustrates XRD spectra of synthesized crystals for $MAPbCl_3$, $MAPbBr_3$, and $MAPbI_3$, according to one or more embodiments of the present disclosure.

The structure of resulting TSCs were investigated by XRD spectra and the results were presented in FIG. 2(c). FIG. 2(c) illustrates XRD spectra of synthesized crystals for MAPbCl$_3$, MAPbBr$_3$, and MAPbI$_3$, according to one or more embodiments of the present disclosure. The MAPbCl$_3$, MAPbBr$_3$ TSCs are cubic structured, while the MAPbI$_3$ TSC is tetragonal.

Figure 5A:
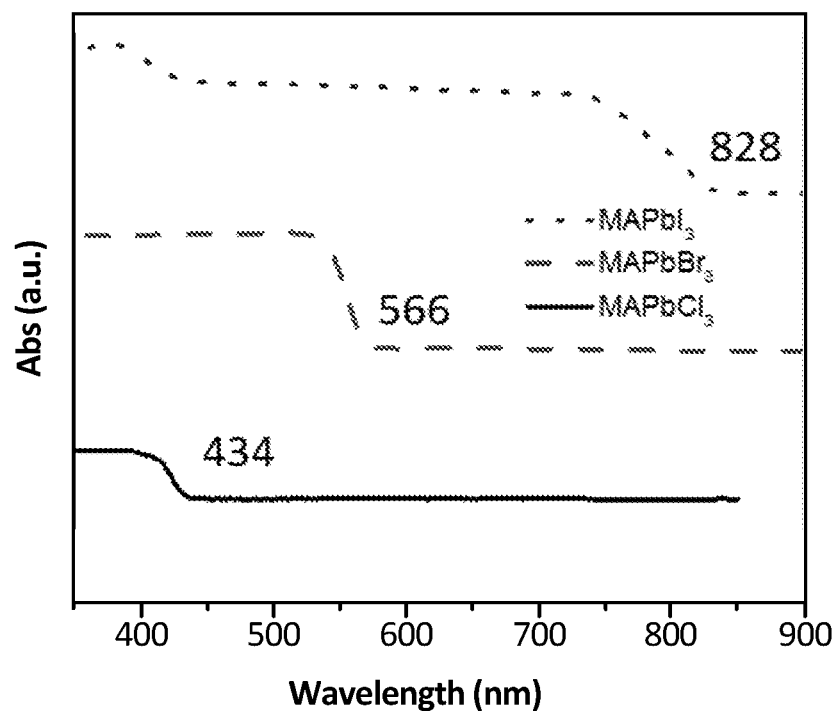
FIG. 5(a) illustrates the UV-Vis photoluminescence spectra of $MAPbX_3$, where X is one or more of Cl, Br, and I PSTCs, according to one or more embodiments of the present disclosure.
Figure 5B:
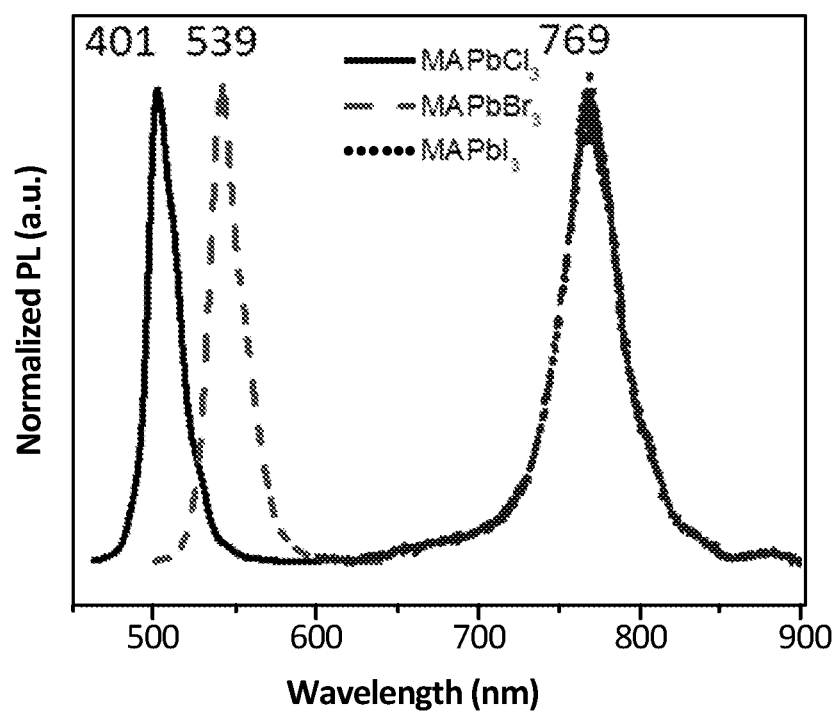
FIG. 5(b) illustrates the steady-state photoluminescence spectra of $MAPbX_3$, where X is one or more of Cl, Br, and I PSTCs, according to one or more embodiments of the present disclosure.

FIG. 5 shows the optical spectra of TSCs synthesized by two-substrate-assistant strategy. FIG. 5(a) illustrates the UV-Vis photoluminescence spectra of MAPbX$_3$, where X is one or more of Cl, Br, and I PSTCs, according to one or more embodiments of the present disclosure. As shown in FIG. 5(a), the uv-vis spectra exhibited absorption onsets at 434 nm, 566 nm and 828 nm for MAPbCl$_3$, MAPbBr$_3$ and MAPbI$_3$, respectively. FIG. 5(b) illustrates the steady-state photoluminescence spectra of MAPbX$_3$, where X is one or more of Cl, Br, and I PSTCs, according to one or more embodiments of the present disclosure. As shown in FIG. 5(b), the TSCs showed narrow PL peaks at 401 nm for Cl, 539 nm for Br and 769 nm for I. The PL blue shifted comparing to the absorption onsets, because the PL light from crystal excitation was absorbed by themselves, so emission for single crystal inside was ruled out and the PL peak detected came from the surface recombination.

Example 2

A Transistor and a Method of Making a Transistor

Chemicals:

Experimental Details. CH$_3$NH$_3$X$_3$ (X=Cl, Br, I) were purchased from Dyesol company. Lead halide PbXr$_2$ (X=Cl, Br, I) were all commercially available from Sigma-Aldrich. Dimethylformamide (DMF) and dimethyl sulfoxide (DMSO) were both purchased from Sigma-Aldrich without further purification. Polyethylene terephthalate (PET).

PSTSCs Synthesis:

First, FET thin film (2spi.com, 2.5 µm thick) was attached on top surface of the substrate. Then a glass slide was attached on top as a cover. After annealing on a hot plate at about 265° C., the PET melted, fixing substrate and glass cover together. Then, 10 µl MAPbX$_3$ (X=Cl, Br, I) precursor solutions were dropped onto the edges between the substrate and glass cover, and the solution spread between the two slides by capillary force. After annealing at fixed temperature for a period of time (which depends on the size of substrate), perovskite single crystal thin films formed. The thickness of the formed perovskite single crystal thin film was about 2.5 µm. The scale of PSTSCs can vary from hundreds of micrometers to several millimeters.

Characterization:

UV-Vis spectra were achieved on Cary 5000 (Varian) spectrophotometer equipped with an integrating sphere. Photoluminescence measurement was conducted on a DXR smart Raman spectrometer with the excitation lasers 325 nm and 473 nm. Optical microscope was acquired from Nikon's SMZ25 stereomicroscope. The thickness of PSSCTF was measured by DEKTAK 8 profiler (Veeco). Powder X-ray diffraction (XRD) measurements were conducted using a Signotone Micromanipulator 5-1160 probe station connected with Keithley 4200 SCS. Atomic force microscope (AFM) images were collected on the Dimension Icon with ScanAsyst AFM equipment (BRUKER). Variable Temperature UHV Scanning tunneling microscope (STM)/STS with Q-plus nc-AFM was also utilized to characterize the surface and edge morphology. I-V measurements of the devices were obtained using a Keithley 4200 Semiconductor Parametric Analyzer and a Signotone Micromanipulator S-1160 probe station. For SCLC measurements, I-V curves were carried out under vacuum (~10$^{-4}$ mbar), in the dark, and at 300 K, in the simple two electrode configuration (Au/MAPbBr$_3$/Au). The perovskite crystal was sandwiched between the rectangular electrodes Au (100-nm thickness), deposited on both sides of the single crystal, by a thermal evaporator. The thickness of MAPbBr$_3$ crystals and MAPbBr$_3$/SWNTs composite crystal were measured via using the digital Vernier caliper. A non-linear response was observed and analyzed according to SCLC theory.

Figure 7A:
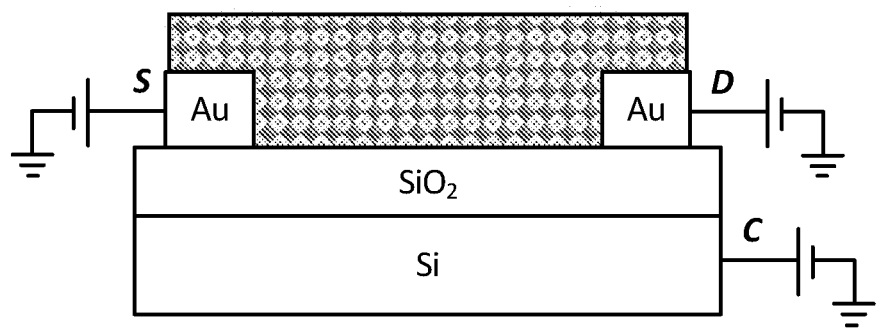
FIG. 7(a) illustrates an FET device structure of $CH_3NH_3PbX_3$, where X is Cl and Br, according to one or more embodiments of the present disclosure.
Figure 7B:
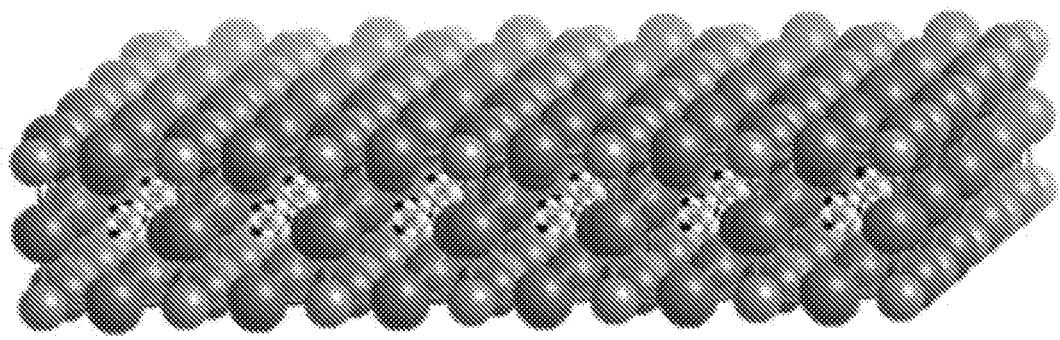
FIG. 7(b) illustrates a cubic structure of $CH_3NH_3PbX_3$, where X is Cl and Br, according to one or more embodiments of the present disclosure.
Figure 7C:
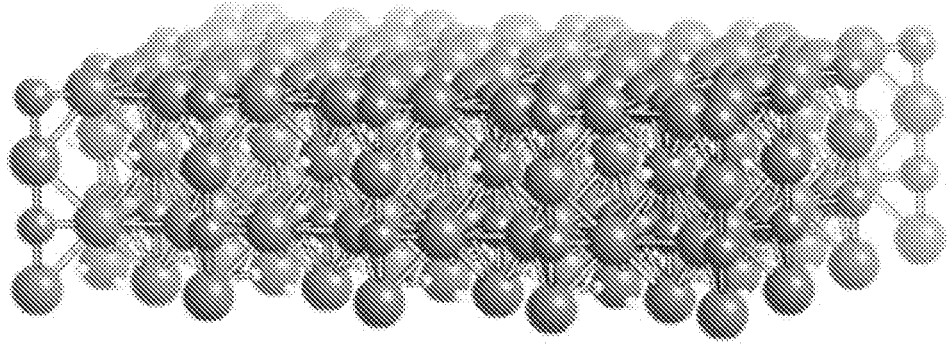
FIG. 7(c) illustrates a tetragonal structure of $CH_3NH_3PbX_3$, where X is I, according to one or more embodiments of the present disclosure.
Figure 8:
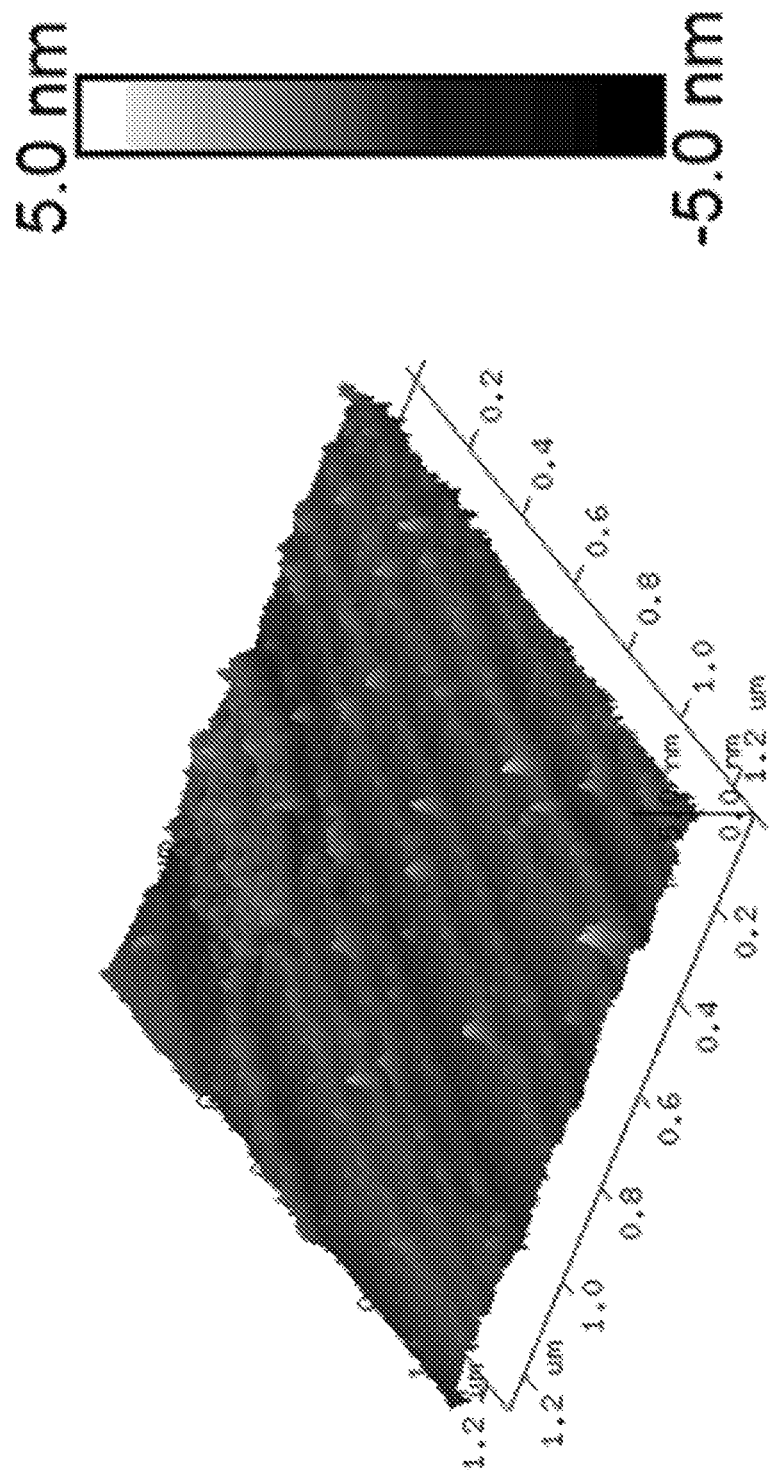
FIG. 8 illustrates a surface morphology of a field effect transistor based on organo-lead halide perovskite thin single crystal showing scale, according to one or more embodiments of the present invention.

The two-substrate-assistant strategy was used to fabricate field-effect-transistors (FETs) using the as-grown TSCs (See Example 1 above). FIG. 8 illustrates a surface morphology of a field effect transistor based on organo-lead halide perovskite thin single crystal showing scale, according to one or more embodiments of the present invention. The structure of the bottom-gated FETs is shown in FIG. 7(a). In particular, FIG. 7(a) illustrates an FET device structure of CH$_3$NH$_3$PbX$_3$, where X is Cl and Br, according to one or more embodiments of the present disclosure. Silicon substrate with 300 nm SiO$_2$ as insulator and patterned Au as electrodes (80 nm) were utilized to grow TSCs directly.

Figure 6A:
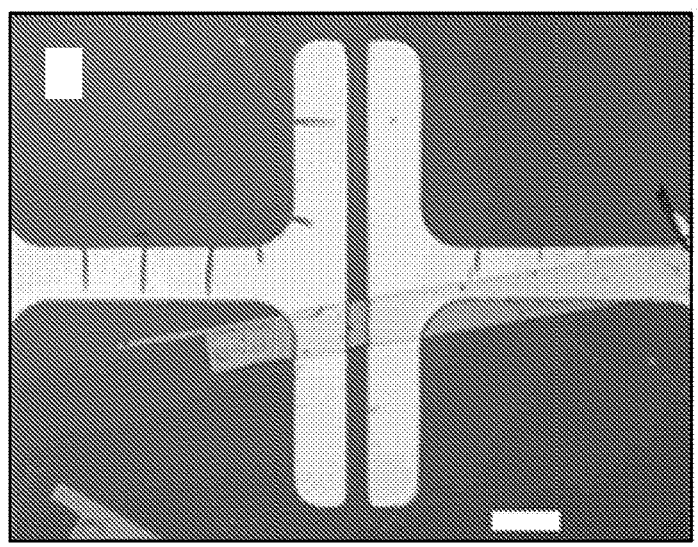
FIGS. 6(a)-(c) illustrate optical images (scale bar 200 µm) of FET devices based on (a) $MAPbCl_3$, (b) $MAPbBr_3$, and (c) $MAPbI_3$ TSCs, according to one or more embodiments of the present disclosure.
Figure 6B:
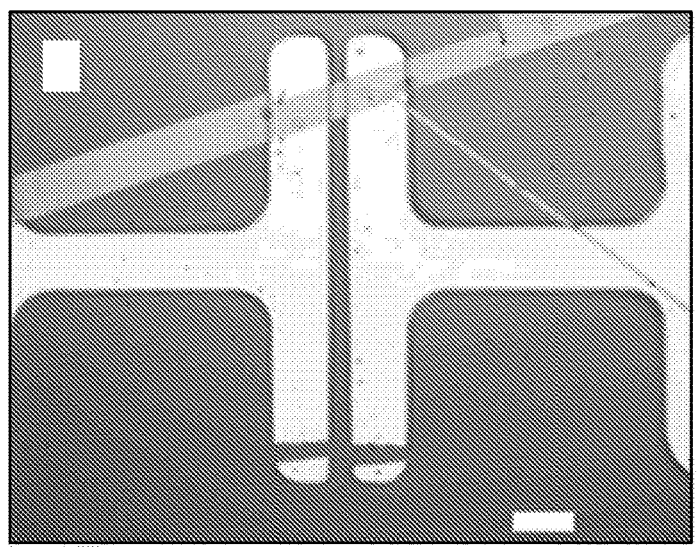
Figure 6C:
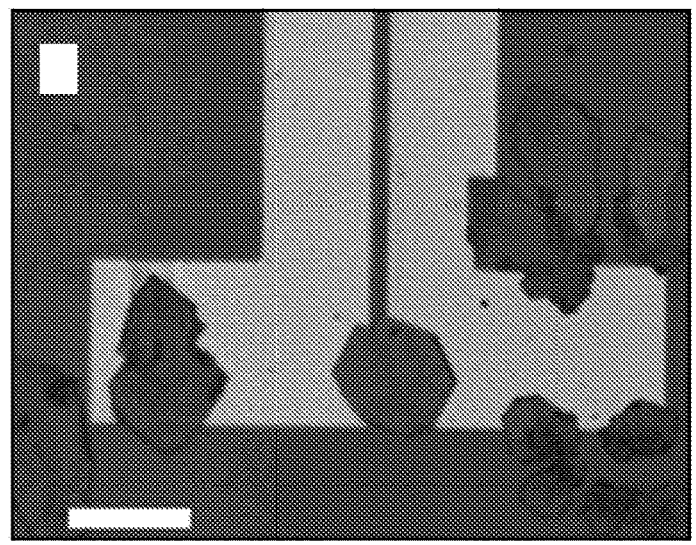

The optical images of various FET devices corresponding to different lead halides are shown in FIG. 6. In particular, FIGS. 6(a)-(c) illustrate optical images (scale bar 200 µm) of FET devices based on (a) MAPbCl$_3$, (b) MAPbBr$_3$, and (c) MAPbI$_3$ TSCs, according to one or more embodiments of the present disclosure. The channel length (L) was about 10 µm, and the width (W) varied in different cases.

Figure 7D:
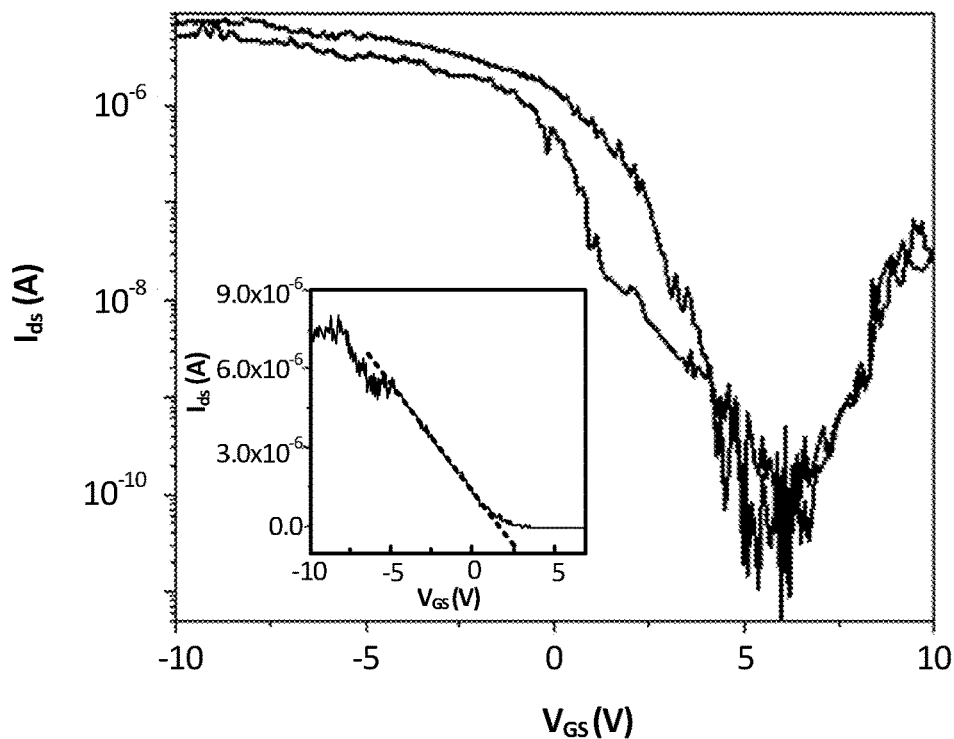
FIGS. 7(d)-(f) illustrate $I_{DS}$ as a function of $V_G$s for $CH_3NH_3PbX_3$, where X is Cl, Br, and I, respectively, according to one or more embodiments of the present disclosure.
Figure 7E:
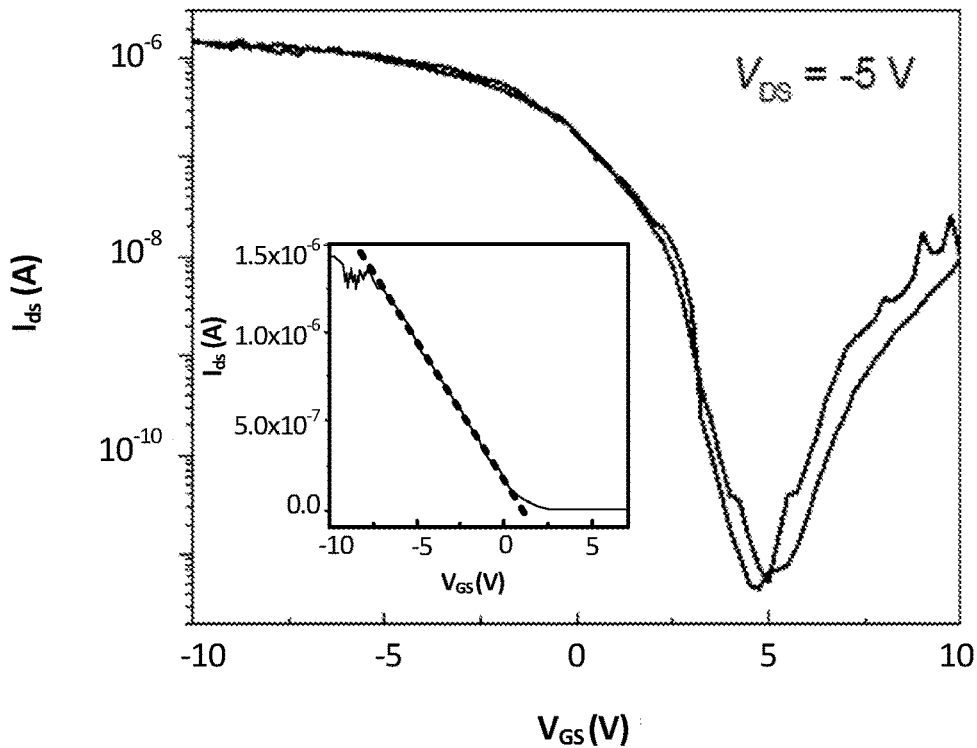
Figure 7F:
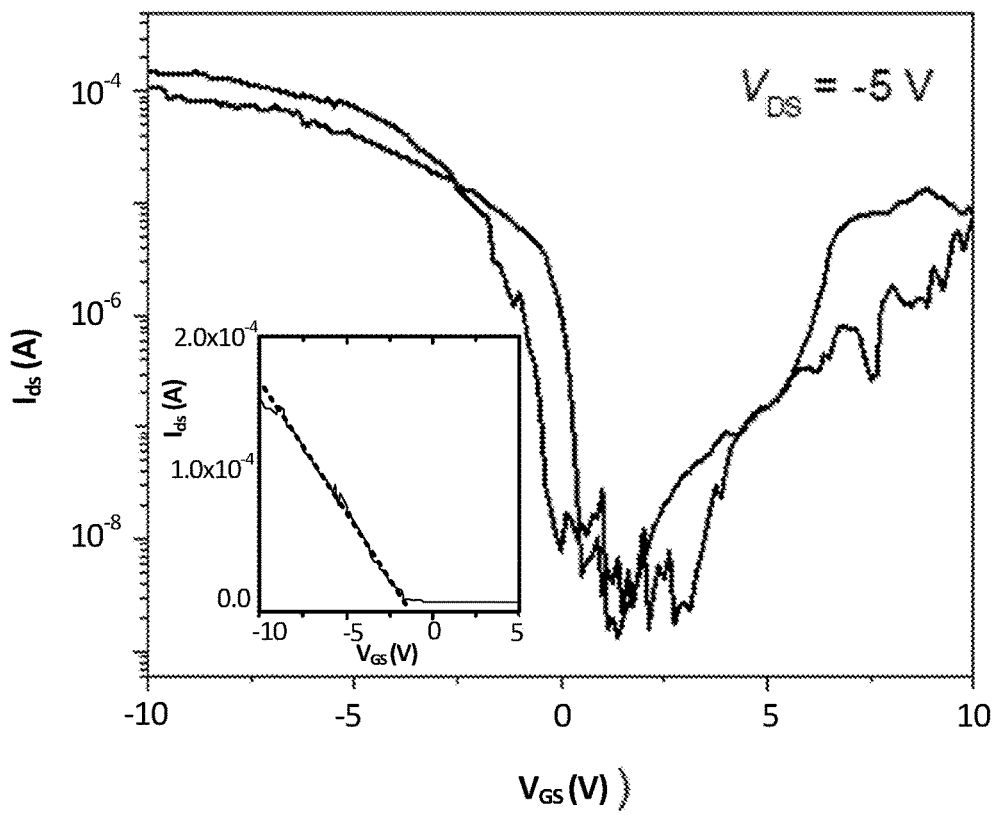
Figure 7G:
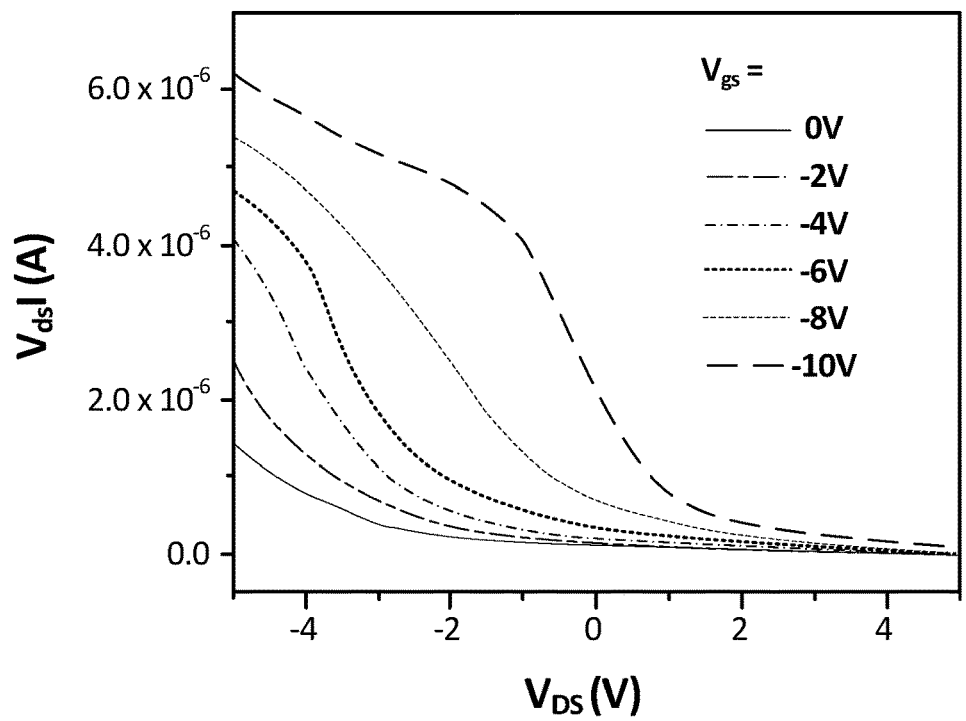
FIGS. 7(g)-(i) illustrate $V_{DS}I$ as a function of $V_{DS}$ for $CH_3NH_3PbX_3$, where X is Cl, Br, and I, respectively, according to one or more embodiments of the present disclosure.
Figure 7H:
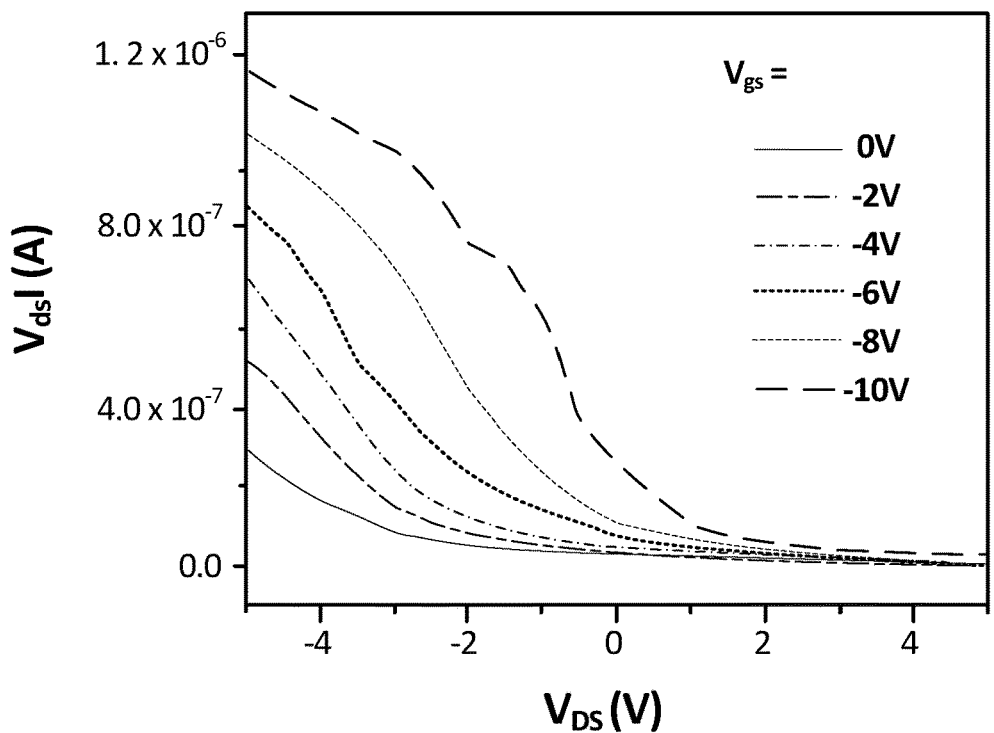
Figure 7I:
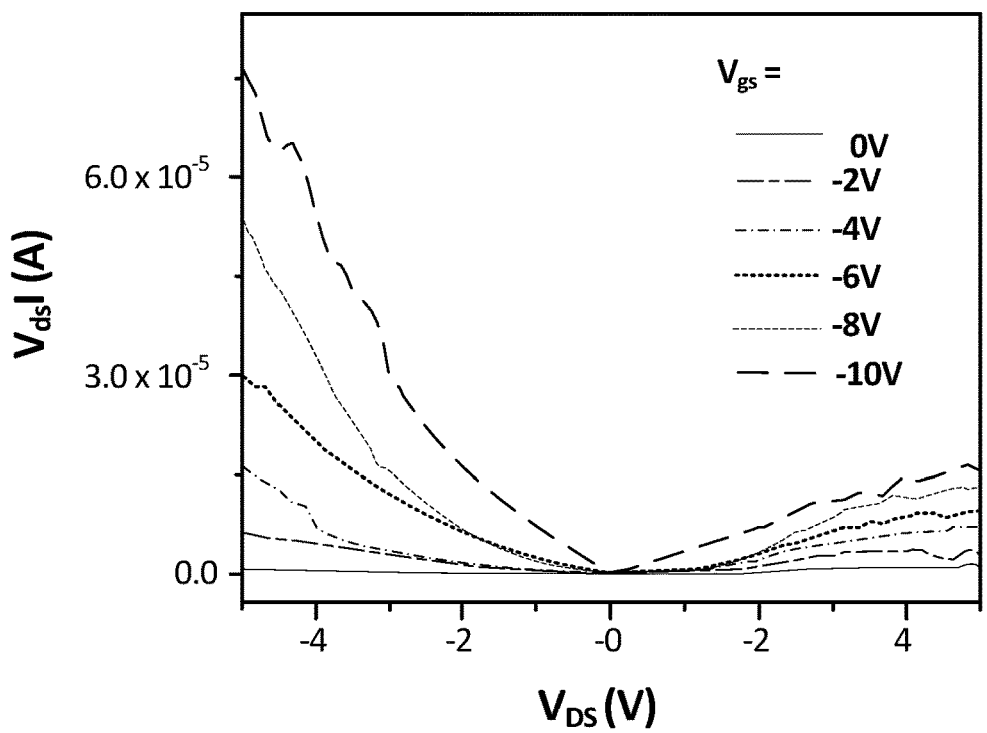

The transfer and output curves of the FET devices based on TSCs of Cl, Br, and I are shown in FIGS. 7(d)-(f) and FIGS. 7(g)-(i), respectively. In particular, FIGS. 7(d)-(f) illustrate $I_{DS}$ as a function of $V_{GS}$ for CH$_3$NH$_3$PbX$_3$, where X is Cl, Br, and I, respectively, according to one or more embodiments of the present disclosure. Also, FIGS. 7(g)-(i) illustrate $V_{DS}I$ as a function of $V_{DS}$ for CH$_3$NH$_3$PbX$_3$, where X is Cl, Br, and I, respectively, according to one or more embodiments of the present disclosure. For all devices, the TSCs exhibited asymmetric curves, indicating ambipolar property of the devices. When $V_{gs}$ is −5 V, the transfer curves of Cl-, Br- and I-based TSCs are shown in (FIG. 7(d)-(f)). The current on/off ratios were 2.2×10$^5$, 2.5×10$^5$ and 1.1×10$^5$, respectively. The threshold voltage ($V_T$) of MAPbCl₃ TSC was calculated to be 4.2 V, and the $V_T$ of MAPbCl₃ was 2.1 V. The positive shift of $V_T$ might come from the unintentional oxygen-induced hole-doping from the bottom dielectric, which was enhanced during the O-zone processing to enhance the hydrophilic property of the substrate. From the linear regimes of the transfer curves, the field-effect mobility (μ) was extracted according to:

$$I_{DS} = \frac{W}{L} C_i \mu (V_{GS} - V_{TH}) V_{DS} \quad (1)$$

Where W and L represent the width and length of channel, $C_i$ is the dielectric constant of SiO₂. The merits of FET based on MAPbX₃ (X=Cl, Br, I) TSCs are summarized in Table 1:

TABLE 1

The Field Effect Mobility of MAPbX₃ (X = Cl, Br, and I) TSCs.

| TSCs | Field Effect Mobility ($cm^2 V^{-1} s^{-1}$) | On/Off Ratio | Threshold Voltage (V) |
|---|---|---|---|
| MAPbCl₃ | $\mu_{hole}$ = 5.15 | $1.52 \times 10^5$ | 1.58 |
| MAPbBr₃ | $\mu_{hole}$ = 4.78 | $3.2 \times 10^5$ | 1.03 |
| MAPbI₃ | $\mu_{hole}$ = 7.9 | $9.15 \times 10^4$ | −1.56 |

The hole mobilities were thus calculated to be 5.15, 4.78 and 7.9 $cm^2 V^{-1} s^{-1}$ for Cl, Br and I TSCs, respectively. These are the highest field effect mobilities ever reported for MAPbCl₃, MAPbBr₃ and MAPbBr₃ single crystals. The mobility of MAPbI₃ perovskites was around 300 fold higher than that of the polycrystalline thin film at room temperature, and over 20 times higher than that of TSCs measured at 77 K.

Figure 9A:
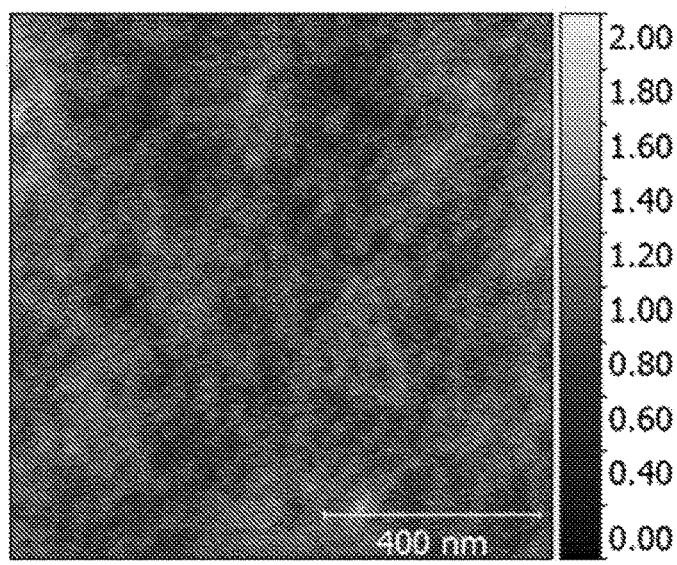
FIG. 9(a)-(c) illustrates AFM images of $CH_3NH_3PbX_3$, where X is Cl, Br, and I, respectively, according to one or more embodiments of the present disclosure.
Figure 9B:
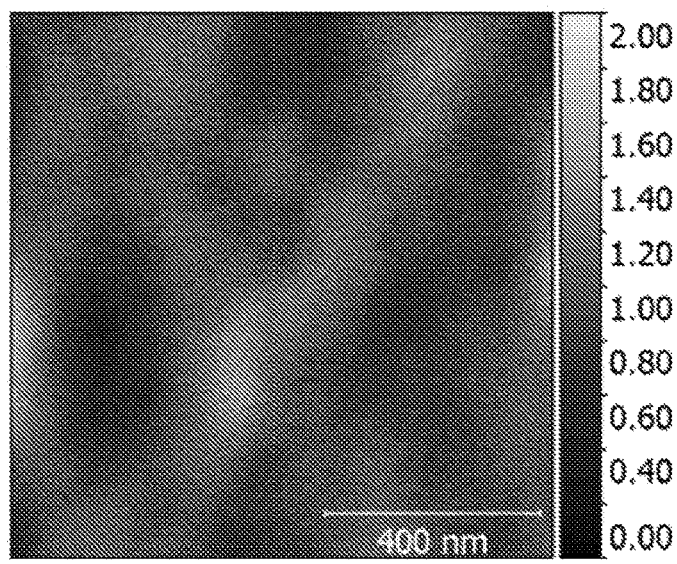
Figure 9C:
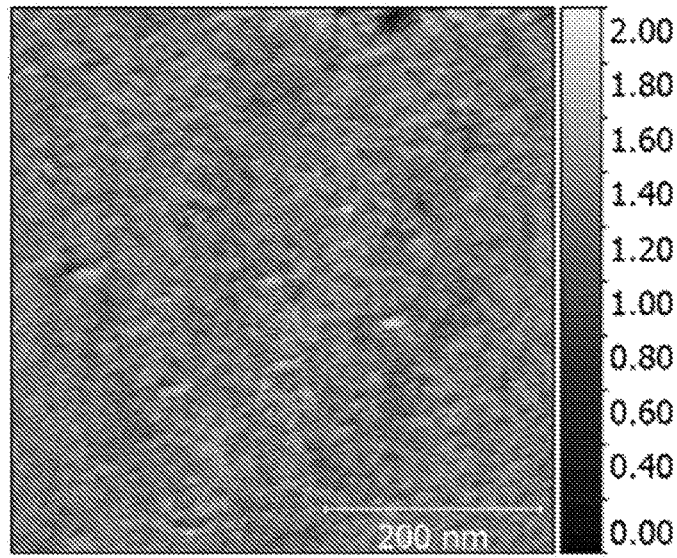

The high field effect mobility was correlated to the high crystallinity and surface morphology of TSCs. For BSC, the key drawback is surface defects or contaminants, which was produced during the single crystal forming process and would affect the optical and electrical properties. A cleaning or peeling process is thus normally applied for making optoelectronics. However, here the surface defects were controlled because the crystals grew between the slides, protected the surface from contamination from outside. For TSC, both surface roughness and surface defects can be well controlled. FIGS. 9(a), (b), and (c) illustrates AFM images of CH₃NH₃PbX₃, where X is Cl, Br, and I, respectively, according to one or more embodiments of the present disclosure. As shown in FIG. 9, the average roughness (Ra) of all there TSCs were below 0.32 nm, which is much less than polycrystalline thin films and bulk crystals. The average roughness was about 0.32 nm for Cl, 0.17 nm for Br, and about 0.024 nm for I. The surface Ra was related to the Ra of glass slides.

Figure 10A:
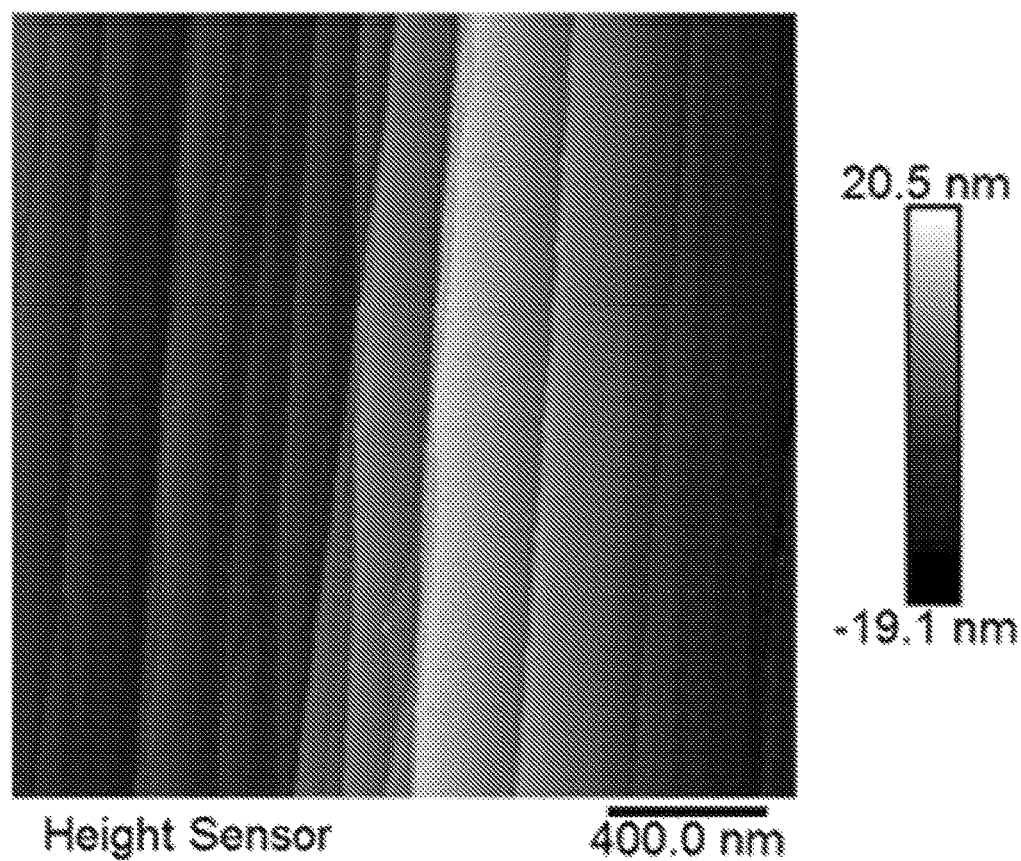
FIGS. 10(a)-(c) illustrate AFM images of edges of $MAPbCl_3$ TSCs, according to one or more embodiments of the present disclosure.
Figure 10B:
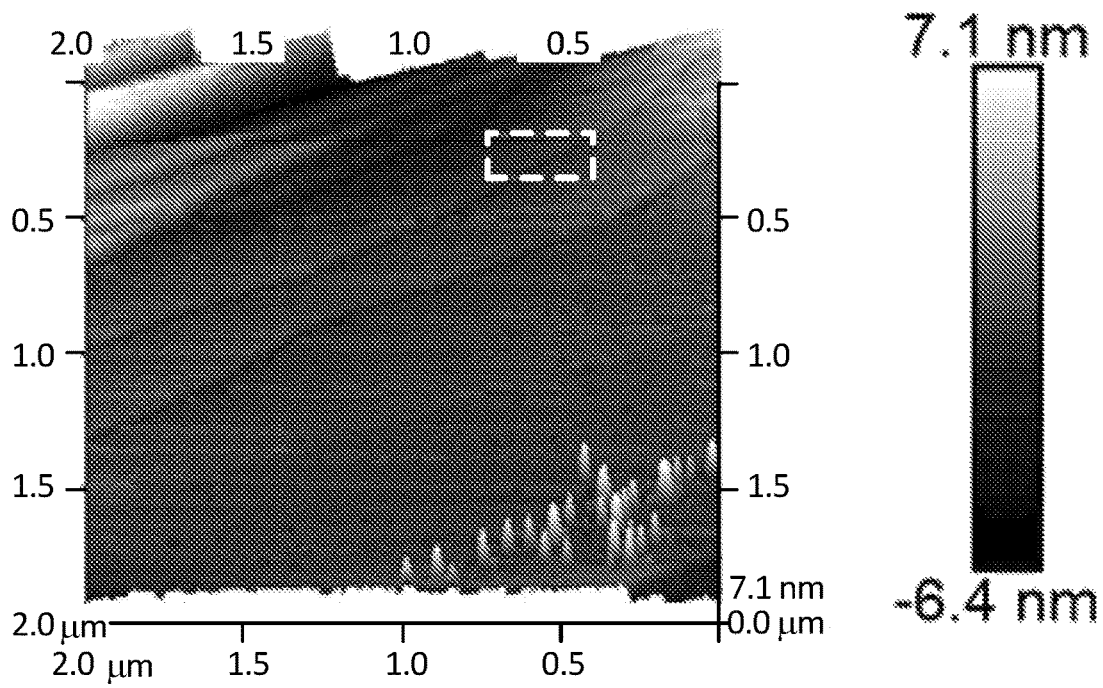
Figure 10C:
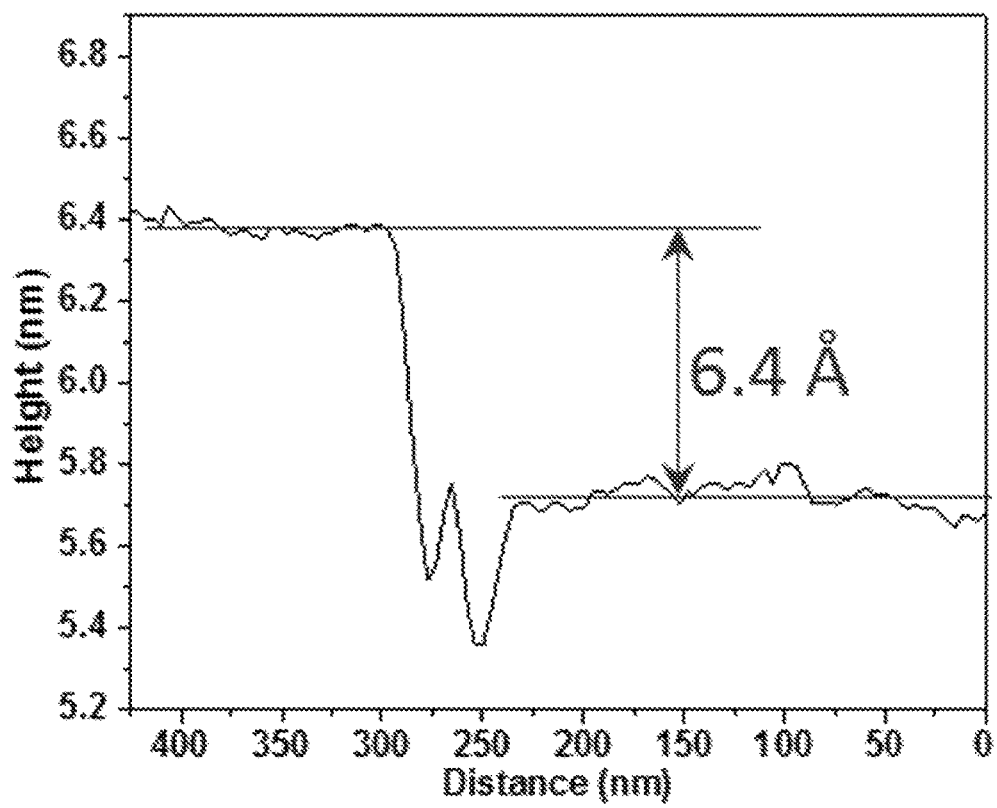
Figure 10D:
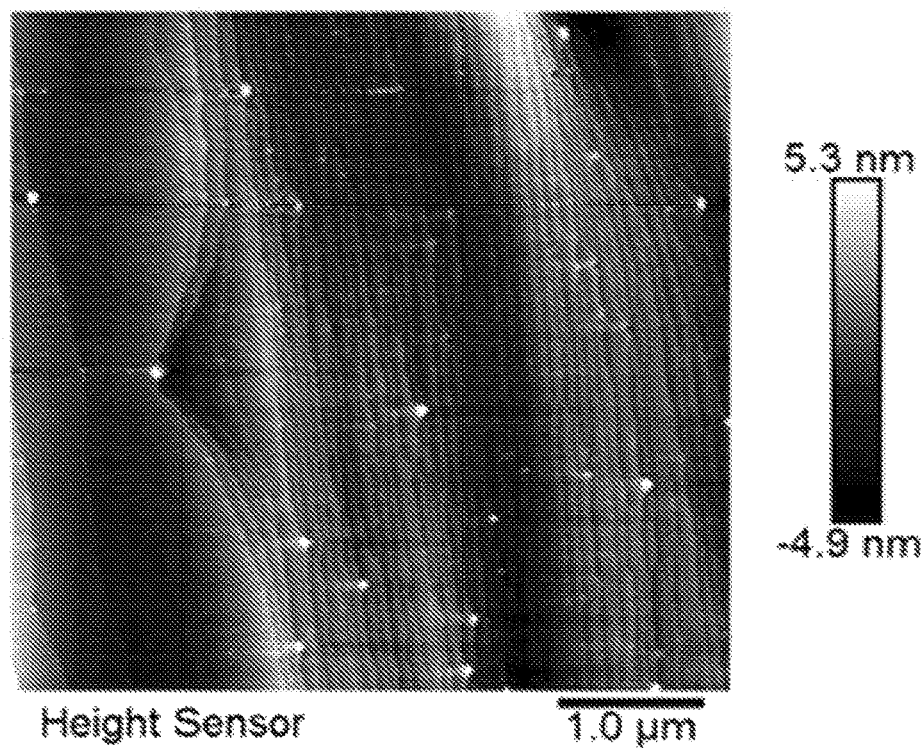
FIGS. 10(d)-(f) illustrate AFM images of edges of $MAPbBr_3$ TSCs, according to one or more embodiments of the present disclosure.
Figure 10E:
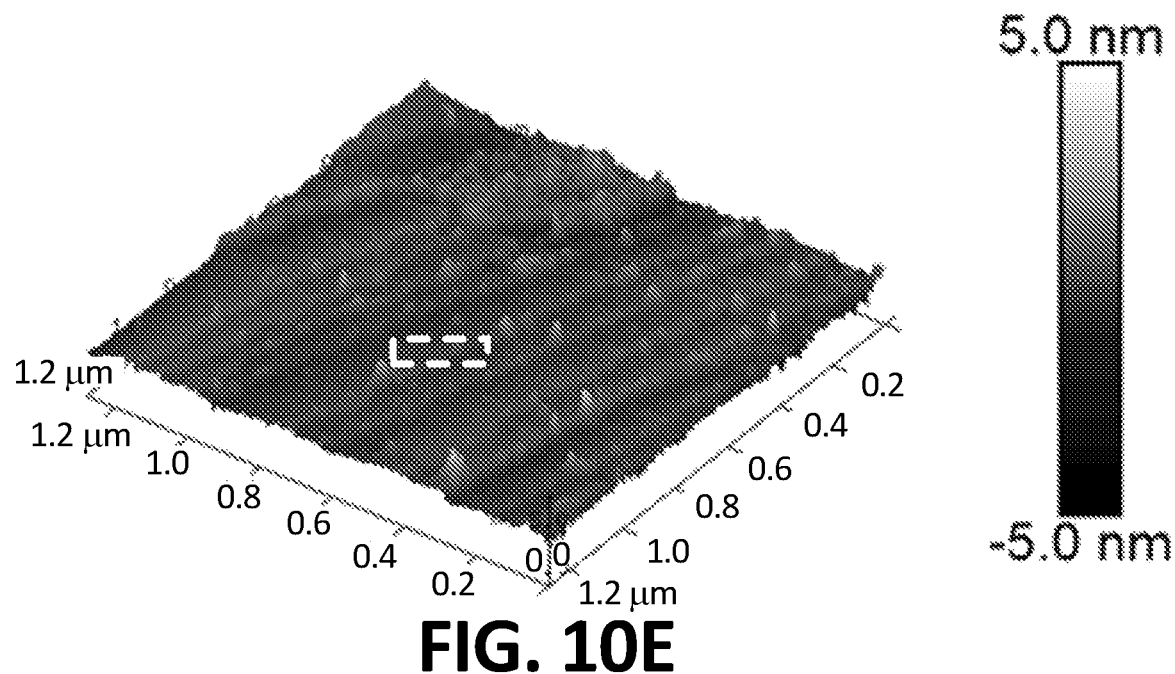
Figure 10F:
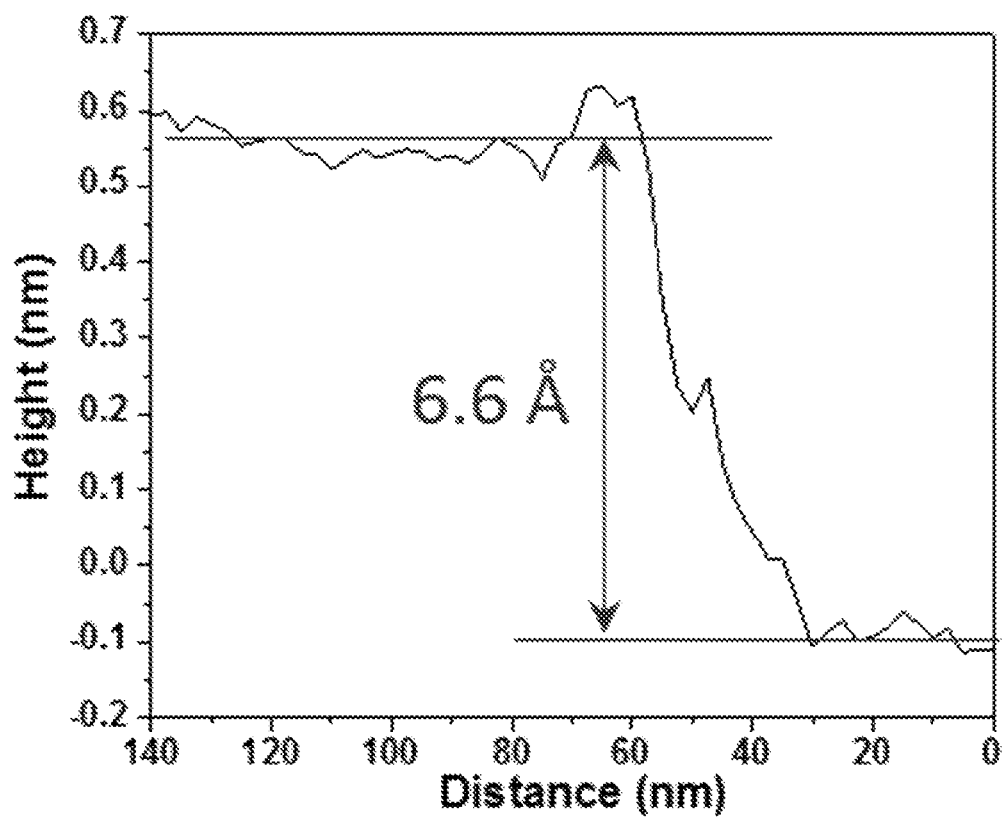

To further confirm the crystal morphology, the edges of the TSCs were characterized by AFM (FIG. 10) and scanning tunneling microscopy (STM) (FIG. 11). FIGS. 10(a)-(c) illustrate AFM images of edges of MAPbCl₃ TSCs, according to one or more embodiments of the present disclosure. FIGS. 10(d)-(f) illustrate AFM images of edges of MAPbBr₃ TSCs, according to one or more embodiments of the present disclosure. FIG. 10 shows the edge morphologies of MAPbCl₃ and MAPbBr₃. Clearly, the TSCs showed layer-by-layer structure, with the layer thickness of 6.4 Å and 6.6 Å for Cl and Br, respectively. The values were slightly larger than the lattice constant of the crystals (crystal lattices of 5.68 Å and 5.92 Å for cubic MAPbCl₃ and MAPbBr₃, respectively), which might due to the structural relaxation at the edge. This is the first time the layer-by-layer structure of cubic perovskite single crystals has ever been observed.

Figure 11A:
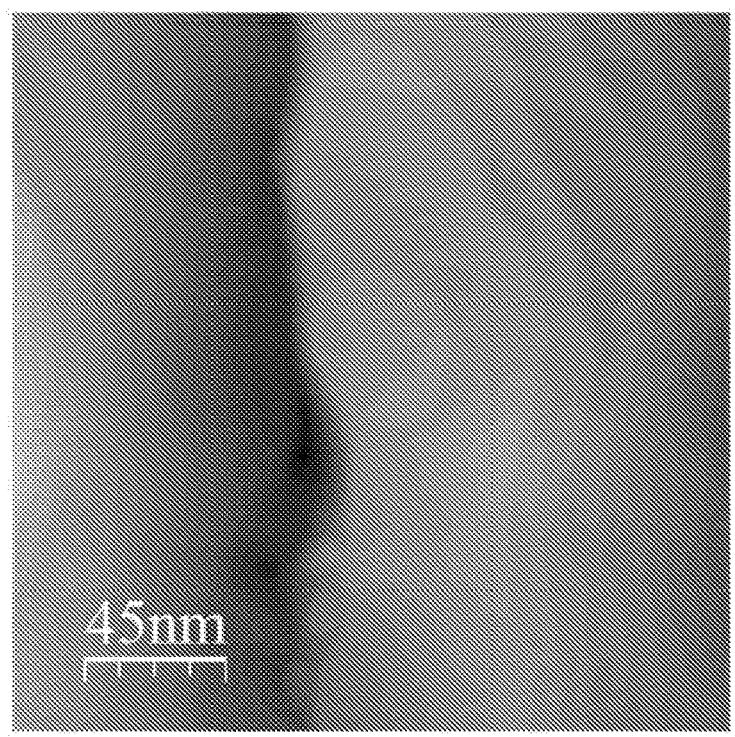
FIG. 11(a) illustrates a STM image of $MAPbBr_3$ TSC edges showing clear layer-by-layer structure, according to one or more embodiments of the present disclosure.
Figure 11B:
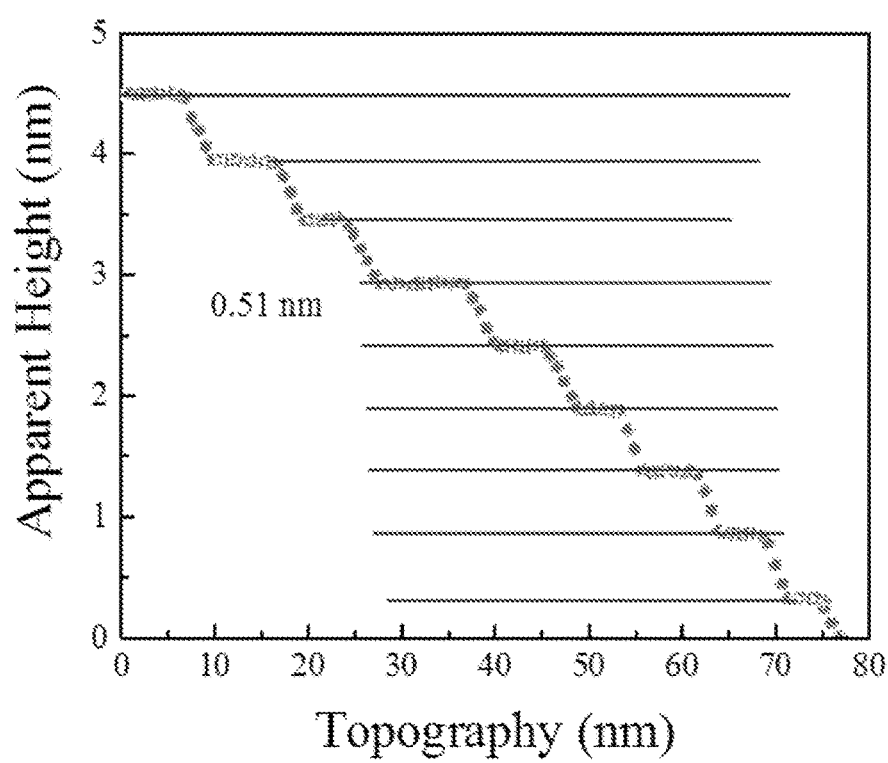
FIG. 11(b) illustrates a graphical view of Apparent Height (nm) as a function of Topography (nm), according to one or more embodiments of the present disclosure.

The layer-by-layer structure of TSC was further confirmed by STM as shown in FIG. 11. FIG. 11(a) illustrates a STM image of MAPbBr₃ TSC edges showing clear layer-by-layer structure, according to one or more embodiments of the present disclosure. FIG. 11(b) illustrates a graphical view of Apparent Height (nm) as a function of Topography (nm), according to one or more embodiments of the present disclosure. As rough surface and grain boundaries lead to more leakage and free carrier decay, the smooth surface avoided shortage and enhanced performance for optoelectronic applications. The layer-by-layer structured edge in the case of MAPbI₃ was not observed due to the tetragonal crystal structure of MAPbI₃ TSCs.

Figure 12A:
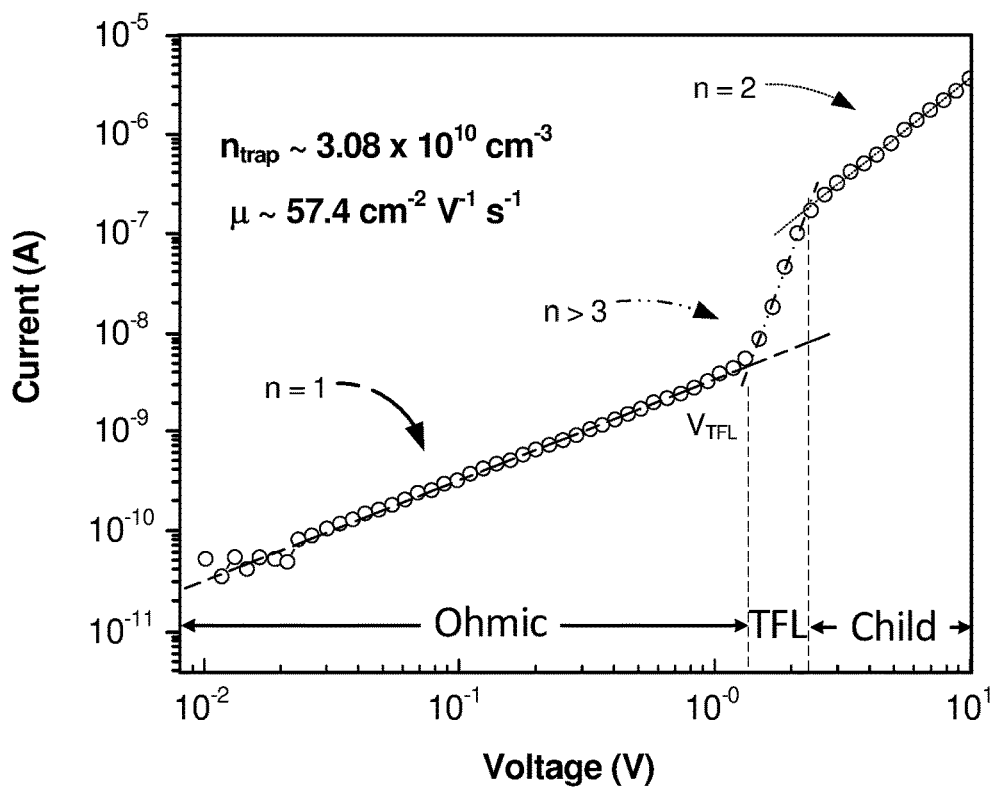
FIGS. 12(a)-(c) illustrate SLCL data of MAPbX$_3$ TSCs, where X is one or more of Cl, Br, and I, respectively, according to one or more embodiments of the present disclosure.
Figure 12B:
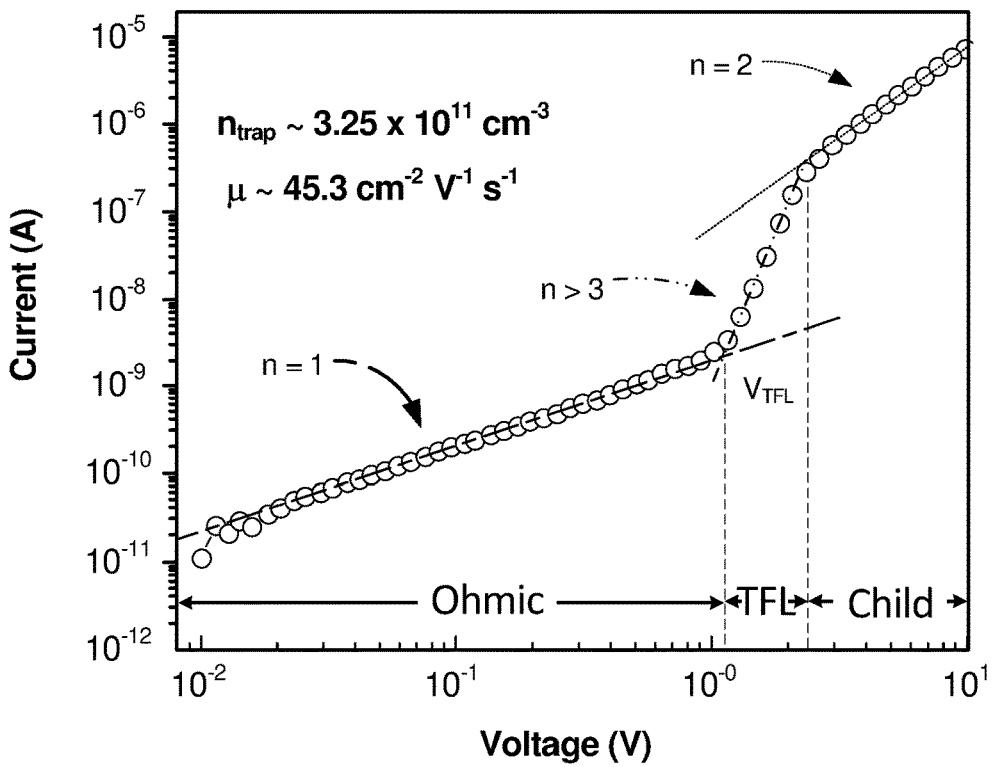
Figure 12C:
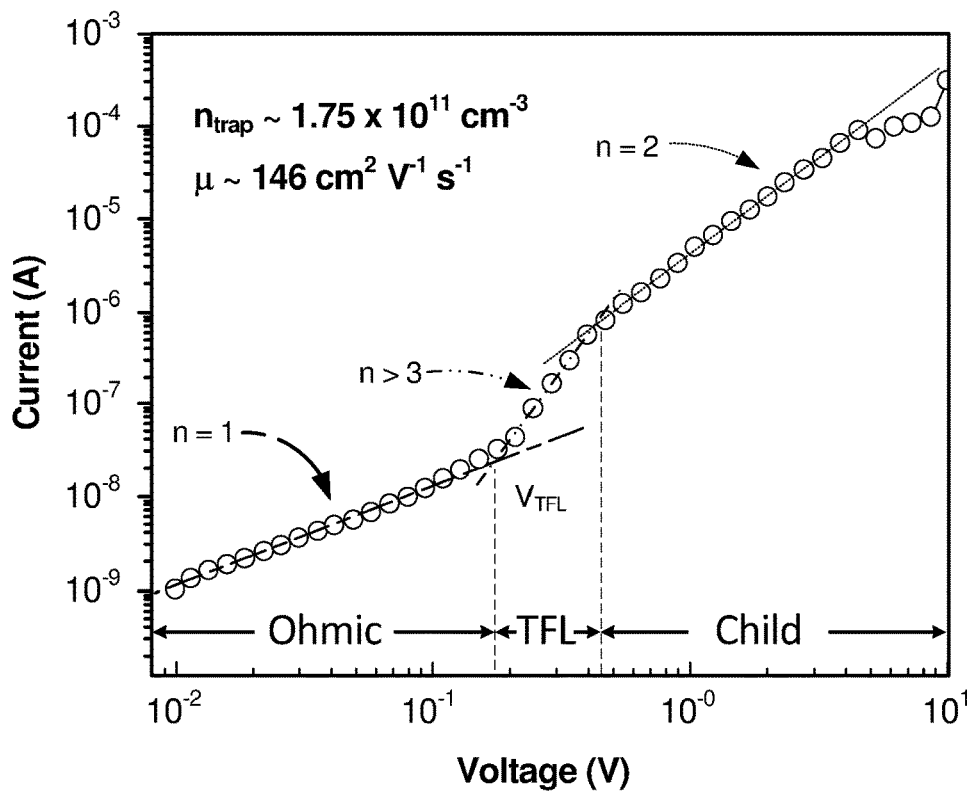

To gain further insight into the high mobility observed in the fabricated FET, the mobility of TSCs was characterized by space-charge-limited-currents (SCLC) measurements (FIG. 12) and also subthreshold swing, S, was measured to estimate the interface trap density between perovskites and substrates. FIGS. 12(a)-(c) illustrate SLCL data and results of MAPbX₃ TSCs, where X is one or more of Cl, Br, and I, respectively, according to one or more embodiments of the present disclosure. According the SCLC data, the mobility of Cl, Br and I based TSCs were calculated to be 57.4, 45.3 and 146 $cm^2 V^{-1} s^{-1}$, respectively, which is higher than that of BSCs with similar trap density. The reason lied in the improved surface morphology of TSCs as evidenced by AFM mentioned above (FIG. 9). See Table 2 for the interfacial trap density and mobility for MAPbX₃ (X=Cl, Br, and I).

TABLE 2

Interfacial Trap State Density and Mobility for MAPbX₃ (X = Cl, Br, and I)

| | MAPbCl₃ | MAPbBr₃ | MAPbI₃ |
|---|---|---|---|
| Trap Density ($cm^{-3}$) | $3.08 \times 10^{10}$ | $3.25 \times 10^{11}$ | $1.75 \times 10^{11}$ |
| Mobility ($cm^{-2} V^{-1} s^{-1}$) | 57.4 | 45.3 | 146 |

Figure 13A:
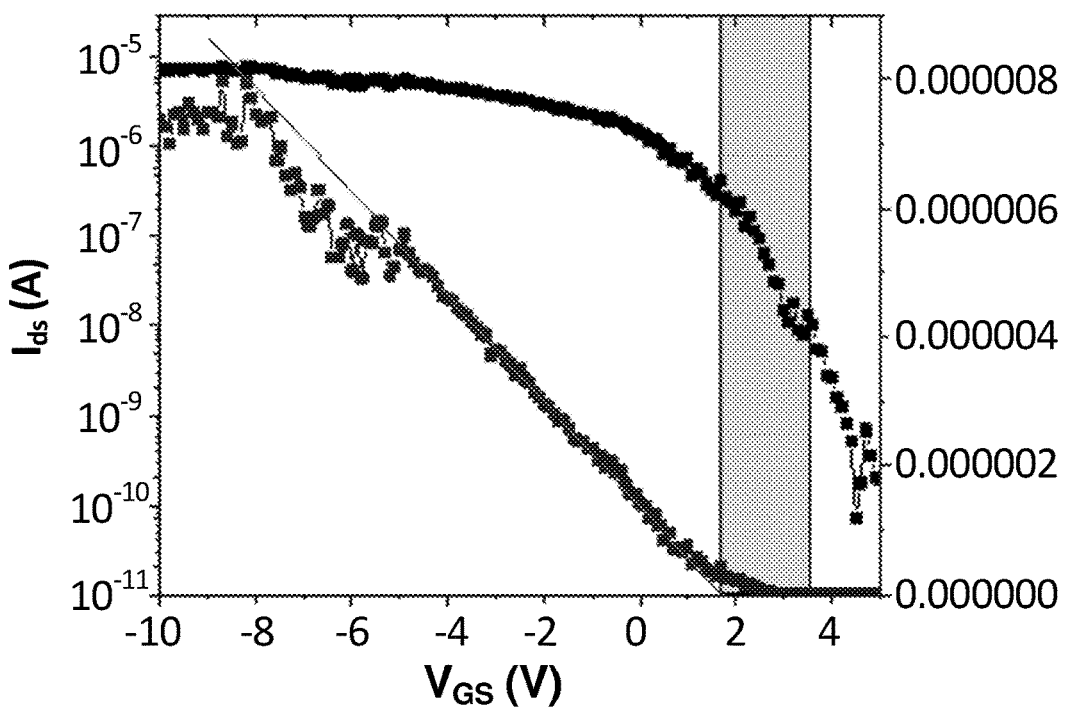
FIGS. 13(a)-(c) illustrate log-scale transfer characteristics of MAPbX$_3$ TSCs, where X is one or more of Cl, Br, and I, respectively, highlighting the subthreshold regimes, according to one or more embodiments of the present disclosure.
Figure 13B:
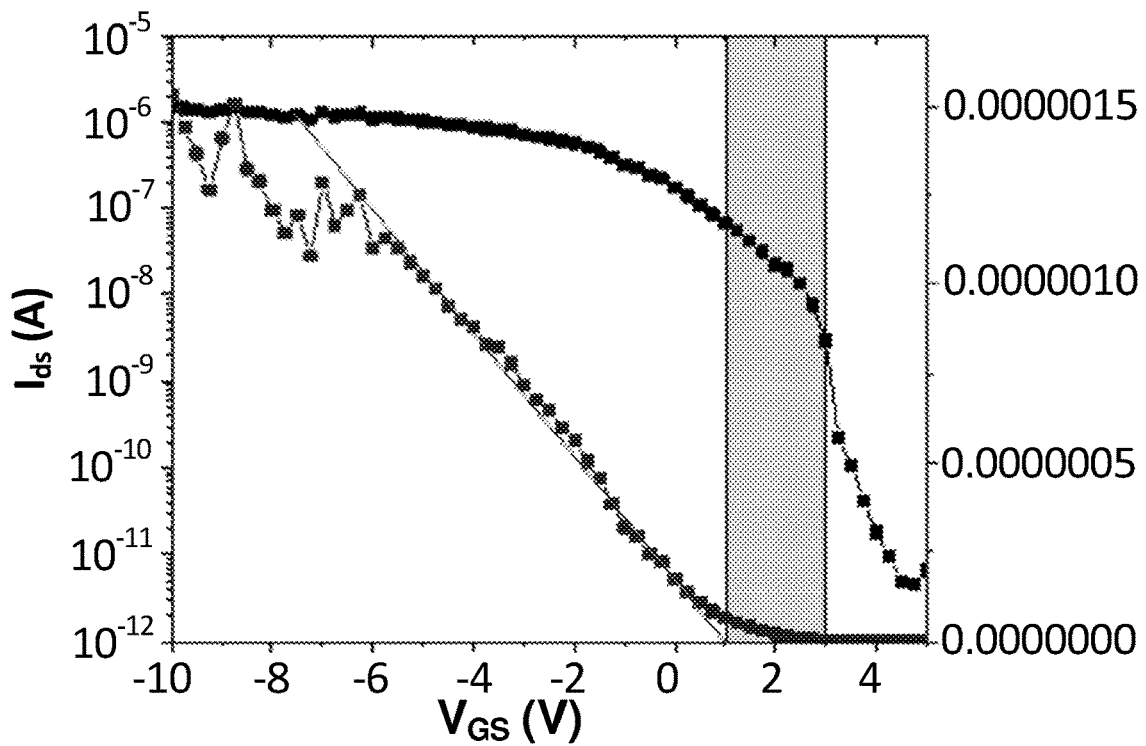
Figure 13C:
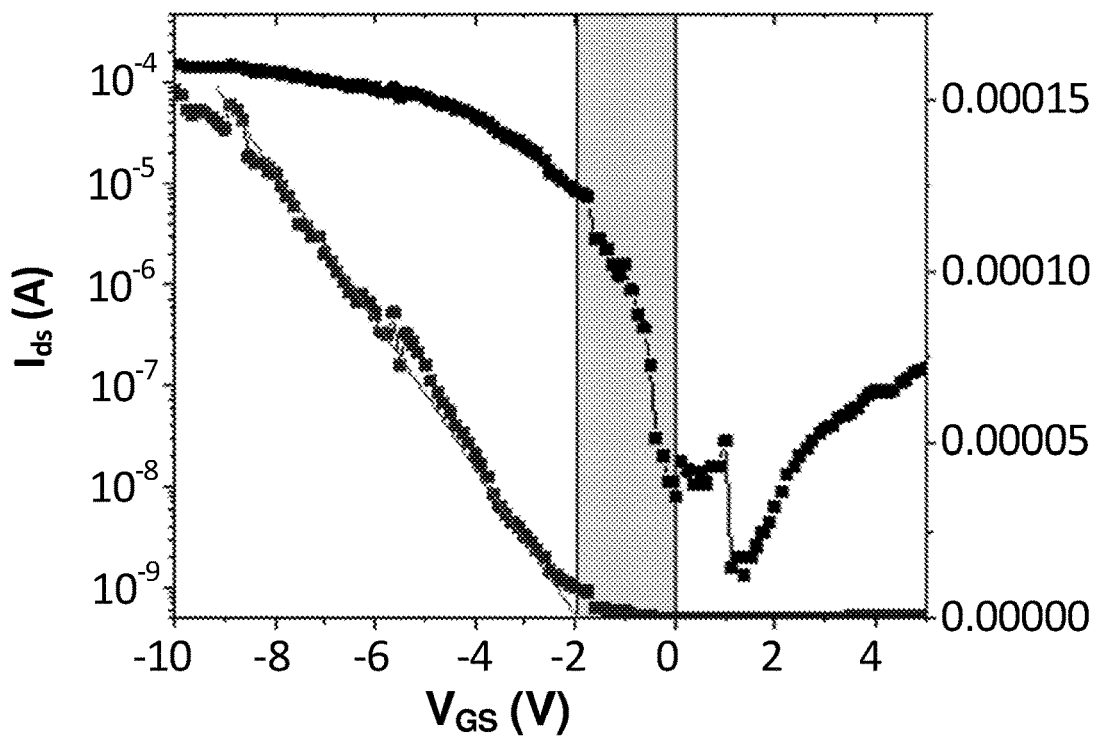

The interface between perovskite TSCs and substrates is one of the key issues that limits the electrical performance and scaling potential of FET devices. The subthreshold swing (S) and interfacial trap state density (Nit) were calculated as shown in FIG. 13 and the results were summarized in Table 3, where $$S = \frac{dV_{Gs}}{d(\log I_{DS})} \text{ and } N_{it} = \left[ \frac{Sa}{kT \ln_{10}} - 1 \right] \frac{C_i}{q},$$

with Ci the capacitance per unit area of the dielectric, q the elementary charge, S the subthreshold swing, k the Boltzmann constant and T the temperature.

TABLE 3

Interfacial Trap State Density and Subthreshold Swings for MAPbX$_3$ (X = Cl, Br, and I)

|  | MAPbCl$_3$ | MAPbBr$_3$ | MAPbI$_3$ |
|---|---|---|---|
| Trap Density N$_{it}$ (eV$^{-1}$ cm$^2$) | $3.68 \times 10^{12}$ | $3.72 \times 10^{12}$ | $2.84 \times 10^{11}$ |
| Subthreshold Swing (V/dec) | 2.52 | 2.53 | 0.252 |

FIGS. 12(a)-(c) illustrate log-scale transfer characteristics of MAPbX$_3$ TSCs, where X is one or more of Cl, Br, and I, respectively, highlighting the subthreshold regimes, according to one or more embodiments of the present invention. The MAPbI$_3$ showed a remarkably low S of 0.252 V/dec, making it suitable as a high performance transistor. The interfacial trap state density of the TSCs were $3.68 \times 10^{12}$, $3.72 \times 10^{12}$ and $2.84 \times 10^{11}$ for Cl, Br and I, respectively. The trap density was higher than that achieved via the SCLC measurement, indicating there are more trap at the surface of the perovskite crystals. However, the trap density at the interfacial is still remarkably lower than that of many other semiconductors. The improved mobility resulted from the optimized interface between perovskites and substrates. While it has been recently disclosed that mesoscale molecular ordering is the key to promoting the spiro-OMeTAD's [2,2',7,7'-tetrakis(N,N-di-p-methoxyphenyl-amine)9,9'-spirobifluorene] charge transport pathways, these results suggest that it also works for organic-inorganic hybrid perovskite, i.e., high molecular ordering in the TSCs is crucial to high field effect mobility.

In summary, TSCs with size above millimeter scale and fixed thickness of around 2.5 micrometers were fabricated via a two-substrate-assistant strategy. The average roughness of the surface of the TSCs can go below 0.32 nm, which is ideal for optoelectronic application and enhancing the performance thereof. Also for the first time, the layer-by-layer structure of cubic perovskite single crystals was observed and confirmed via AFM and STM characterizations. As a potential application, TSCs based field effect transistor (FET) was prepared, which showed ambipolar property with the majority carrier mobility of 5.15 cm$^2$ V$^{-1}$s$^{-1}$, 4.78 cm$^2$V$^{-1}$s$^{-1}$ and 7.9 cm$^2$V$^{-1}$s$^{-1}$ for Cl, Br and I based TSCs, respectively, the highest value ever reported until now.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto Various examples have been described. These and other examples are within the scope of the following claims.

What is claimed is:

1. A method of fabricating a semiconducting material, comprising:
   fixing a first substrate to a second substrate via a bonding material sufficient to form a two-substrate support with a cavity region;
   applying an organo-lead halide perovskite precursor solution to the cavity region of the two-substrate support; and
   annealing sufficient to form in the cavity region a semiconducting material including an organo-lead halide perovskite thin single crystal.

2. The method of claim 1, wherein the first substrate and the second substrate include one or more of an inert material, an inert compound, and an inert element.

3. The method of claim 1, wherein the first substrate and the second substrate include one or more of a glass slide, a semiconducting substrate, and an electrically insulating substrate.

4. The method of claim 1, wherein the first substrate and second substrate include one or more of a glass slide, a silicon substrate, and a silicon oxide substrate.

5. The method of claim 1, wherein the bonding material includes polyethylene terephthalate.

6. The method of claim 1, wherein the cavity region is vacant before the applying step is performed.

7. The method of claim 1, wherein the organo-lead perovskite precursor solution includes one or more of γ-butyrolactone, N,N-dimethylformamide, dimethylsulphoxide, MAX, and PbX$_2$, wherein MA is CH$_3$NH$_3^+$ and X is one or more of Cl$^-$, Br$^-$, and I$^-$.

8. The method of claim 1, wherein the organo-lead halide perovskite thin single crystal is characterized by the formula MAPbX$_3$, where MA is CH$_3$NH$_3^+$ and X is one or more of Cl$^-$, Br$^-$, and I$^-$.

9. The method of claim 1, wherein the organo-lead halide perovskite thin single crystal is one or more of cubic structured and tetragonal structured.

10. The method of claim 1, wherein the organo-lead halide perovskite thin single crystal is one or more of rectangular and square.

11. The method of claim 1, wherein the organo-lead halide perovskite thin single crystal is about 5 mm.

12. The method of claim 1, wherein a thickness of the semiconducting material is tunable and/or controllable by adjusting a height of the cavity region.

13. The method of claim 12, wherein adjusting the height of the cavity region includes adjusting a thickness of the bonding material.

14. The method of claim 1, wherein a size of the semiconducting material is tunable by controlling the amount of precursor solution.

15. The method of claim 1, further comprising applying an additional amount of the organo-lead halide precursor solution to the cavity region of the two-substrate support one or more times to increase a size of the semiconducting material.

* * * * *